(12) United States Patent
Nakamura

(10) Patent No.: US 6,226,325 B1
(45) Date of Patent: May 1, 2001

(54) DIGITAL DATA PROCESSING SYSTEM

(75) Inventor: Shinichi Nakamura, Sagamihara (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 08/801,588

(22) Filed: Feb. 18, 1997

(30) Foreign Application Priority Data

Mar. 27, 1996 (JP) .................................. 8-072189
Apr. 8, 1996 (JP) .................................. 8-085420

(51) Int. Cl.⁷ .............................. H04B 1/66; G10L 21/00
(52) U.S. Cl. .......................................... 375/240; 704/504
(58) Field of Search ........................ 1/1; 704/229, 201, 704/230, 205, 212, 500; 375/244, 242, 240, 241, 243, 245; 360/32, 48, 40; 386/112, 109, 124, 40, 101, 105, 104, 122, 126, 96, 95; 348/390, 384, 420, 423, 405, 421; 341/61, 143, 195, 123, 51, 67; 320/477; 371/31

(56) References Cited

U.S. PATENT DOCUMENTS

| | | | |
|---|---|---|---|
| 4,183,065 | * 1/1980 | Rhody et al. | 360/9 |
| 5,113,266 | * 5/1992 | Suguira | 358/426 |
| 5,153,723 | * 10/1992 | Citta | 358/143 |
| 5,416,644 | * 5/1995 | Beuker et al. | 360/33.1 |
| 5,440,596 | 8/1995 | Kneepkens et al. | 375/240 |
| 5,488,663 | 1/1996 | Dewolf et al. | 380/49 |

FOREIGN PATENT DOCUMENTS 5-276051  10/1993 (JP) .

* cited by examiner

Primary Examiner—William Luther
(74) Attorney, Agent, or Firm—Pilsbury Winthrop LLP

(57) ABSTRACT

Data obtained by dividing digital data into a low-frequency signal and a high-frequency signal and converting the low-frequency signal and a signal obtained by subjecting the high-frequency signal to a lossless compression coding process into a transmission format is transmitted. The lossless compression coding process is effected by dividing a digital data string input in the unit of sample constructed by a preset number of bits into block units constructed by a plurality of samples, removing a constant number of bits having a common value from each sample starting from the sign bit side thereof for all of the samples in each block to form a compressed block and attaching information indicating the number of removed bits to the compressed block.

22 Claims, 23 Drawing Sheets

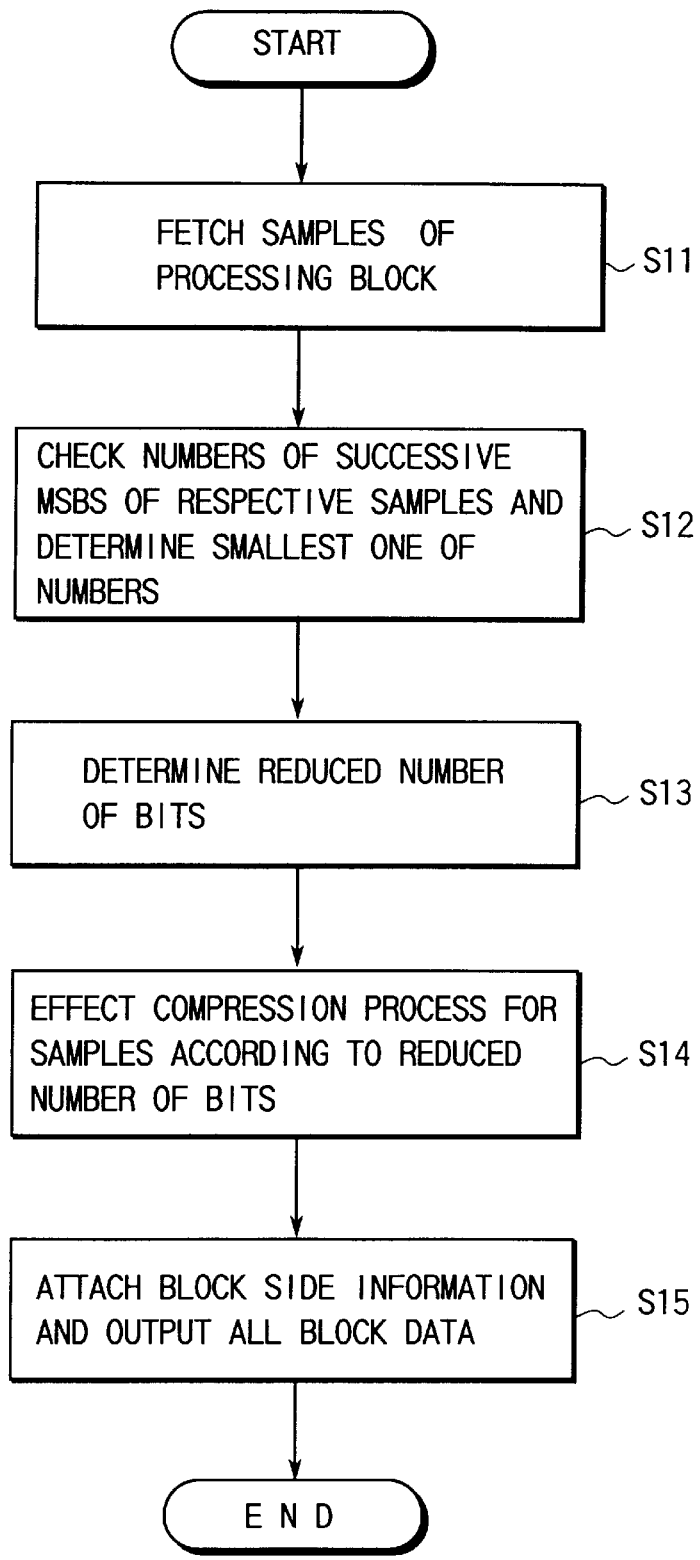
F I G. 4

BLOCK SIDE INFORMATION
BLOCK SCALE FACTOR=5
SUBBLOCK SIZE=4
SUBBLOCK SIDE INFORMATION
SUBBLOCK SCALE FACTOR
           (4bit):[SSSS]
SSSSM************
    M**************
    MMMM********
    MM**********
SSSSM************
    M************
    M****************
    M**************
SSSSM******************
    M************
    M************
    MMM*********
SSSSMMMM******
    MMMM******
    M*********
    MMM******
F I G. 5 A
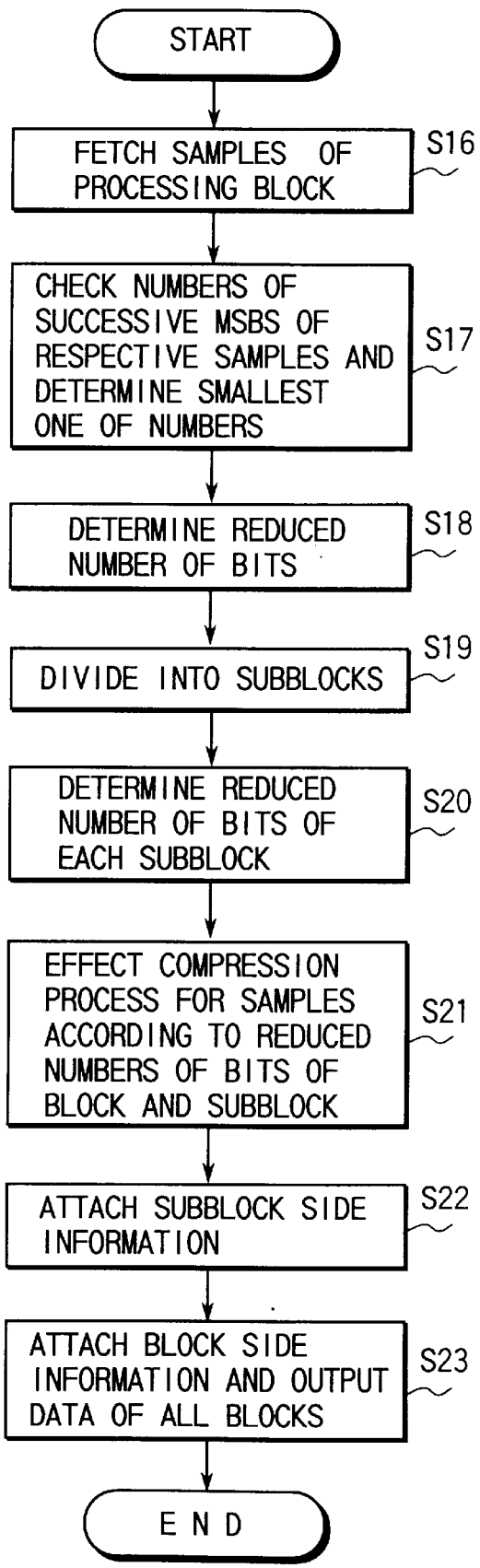
F I G. 5 B

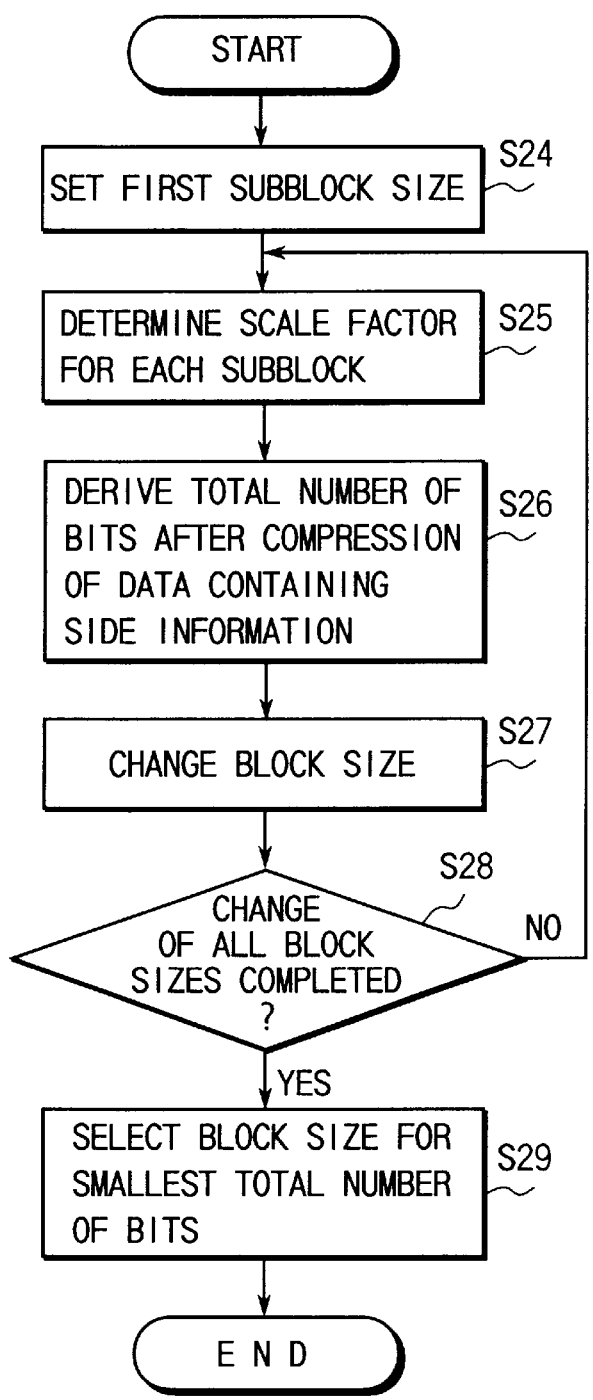

FIG. 6A

BLOCK SIDE INFORMATION
BLOCK SCALE FACTOR=5

SAMPLE SIDE INFORMATION

SAMPLE BLOCK SCALE FACTOR
(3bit):[SSS]

SSSM★★★★★★★★★★★
SSSM★★★★★★★★★★★★★
SSSMMMM★★★★★★★★
SSSMM★★★★★★★★★
SSSM★★★★★★★★★★★
SSSM★★★★★★★★★★★★
SSSM★★★★★★★★★★★★★★★★
SSSM★★★★★★★★★★★★★★
SSSM★★★★★★★★★★★★★★★
SSSM★★★★★★★★★★★★
SSSM★★★★★★★★★★★★
SSSMMM★★★★★★★★
SSSMMMMM★★★★★★
SSSMMMMM★★★★★★
SSSMMM★★★★★★★★
SSSMMMM★★★★★★

BLOCK SIDE INFORMATION
BLOCK SCALE FACTOR=5

S=1: SCALING +1
S=0: SCALING −1

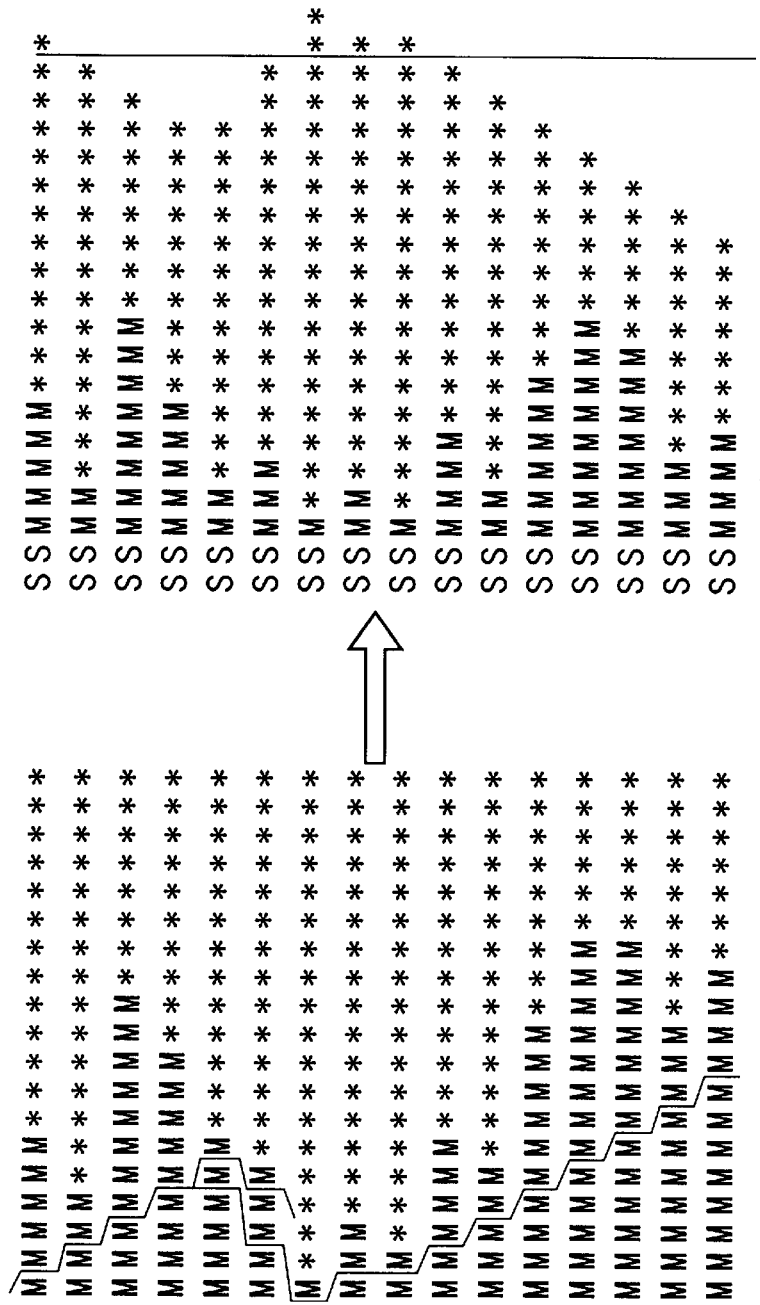

BLOCK SIDE INFORMATION

BLOCK SCALE FACTOR=5

S=1: SCALE FACTOR +1
S=0: SCALE FACTOR ±0
S=2: SCALE FACTOR −1
S=3: SCALE FACTOR=0: (RESET)

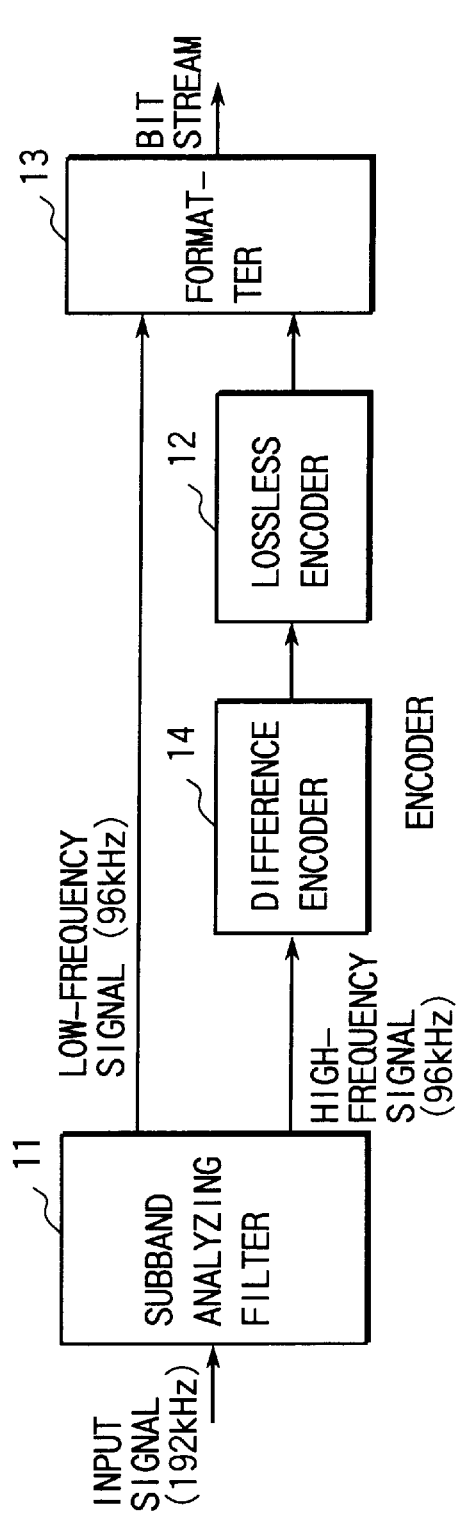
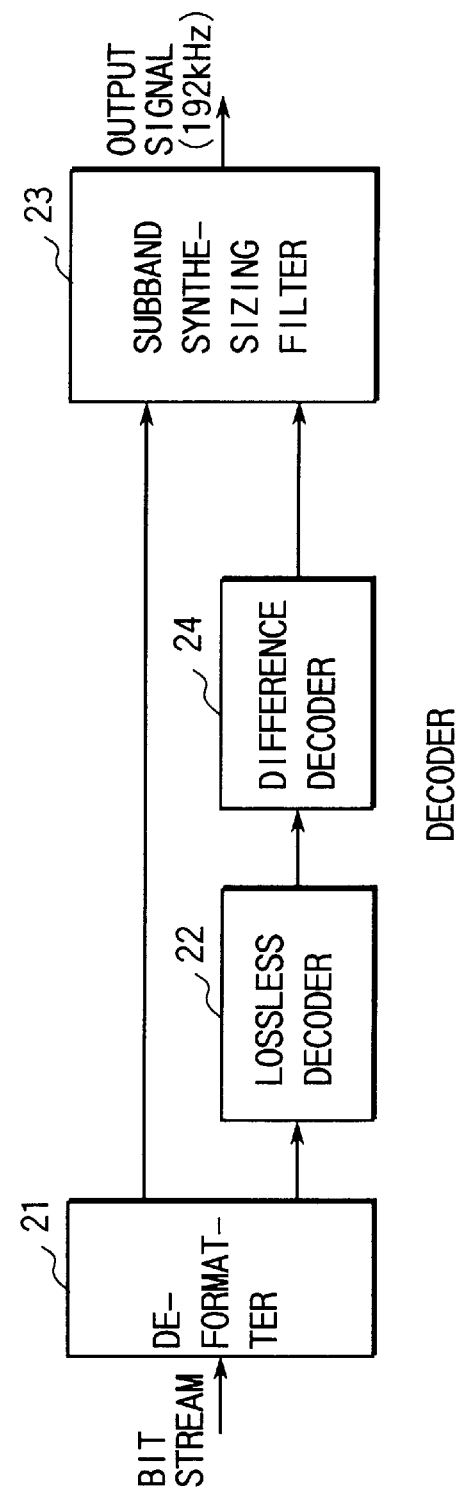
F I G. 11A
F I G. 11B

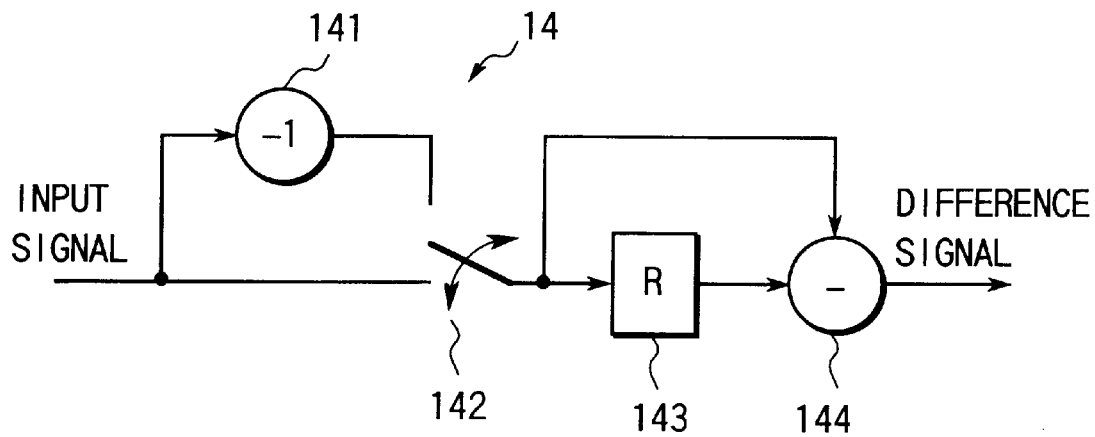
F I G. 1 2 A
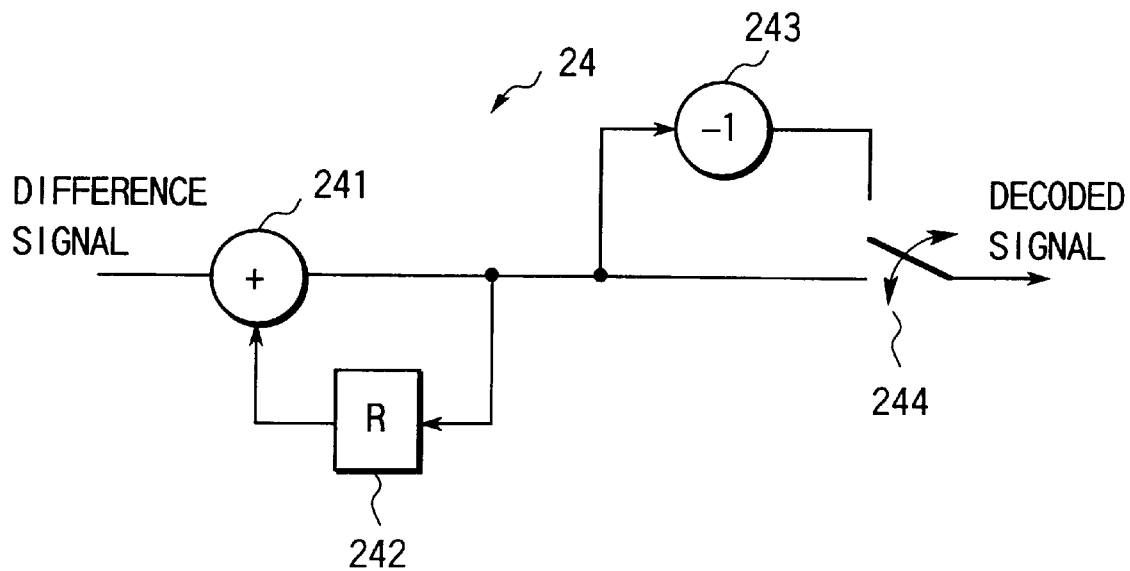
F I G. 1 2 B

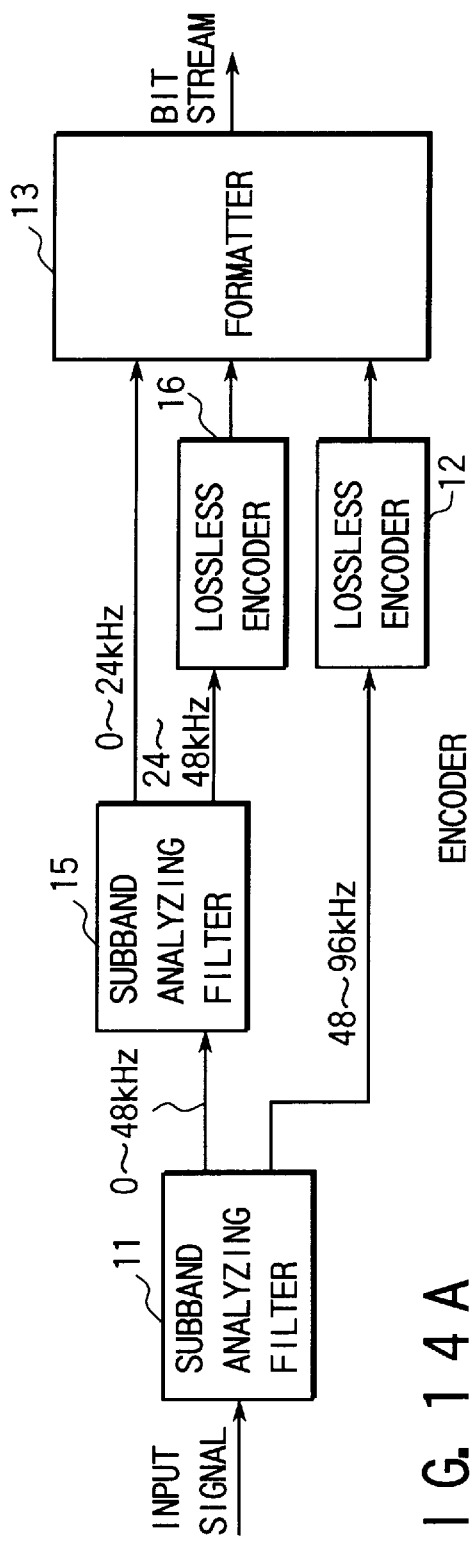
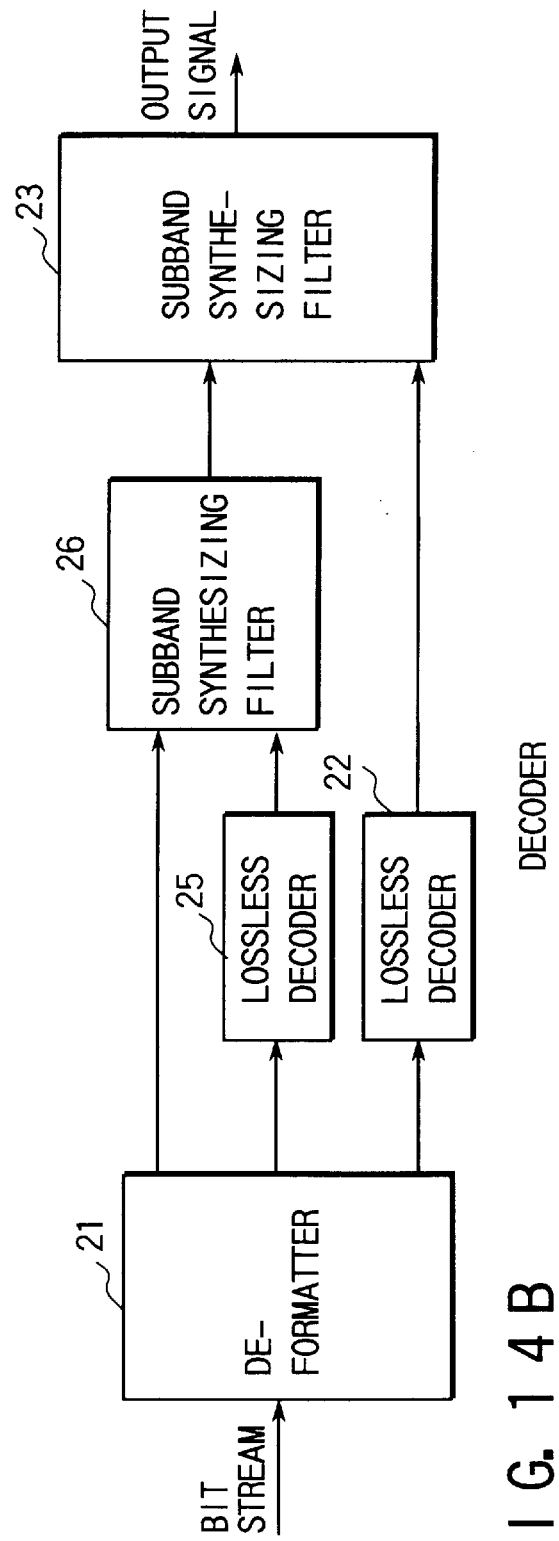
F I G. 14A
F I G. 14B

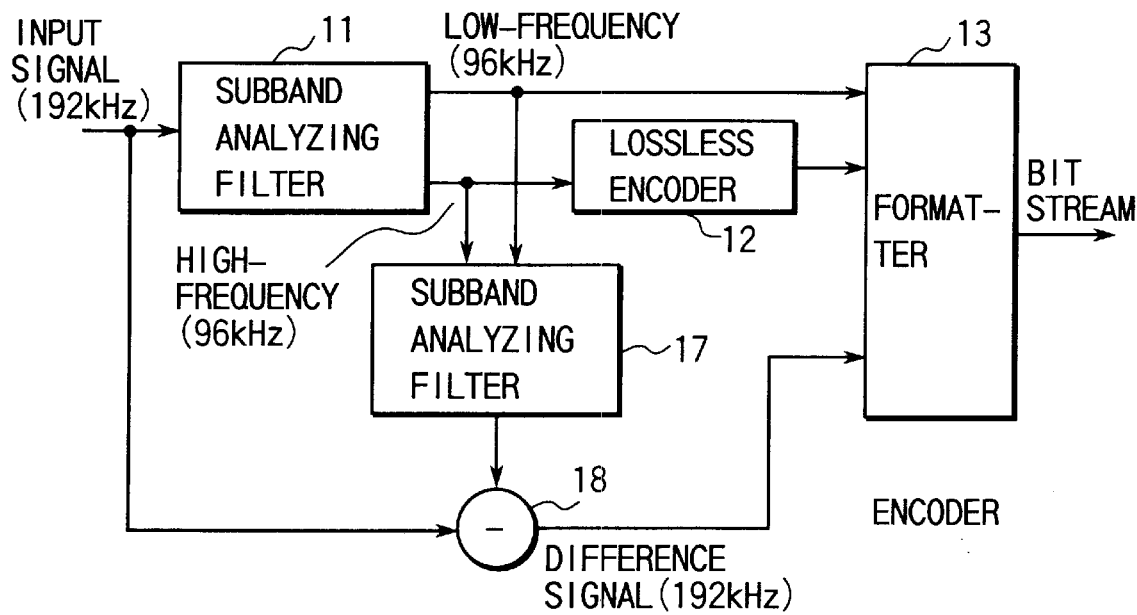
F I G. 1 5 A
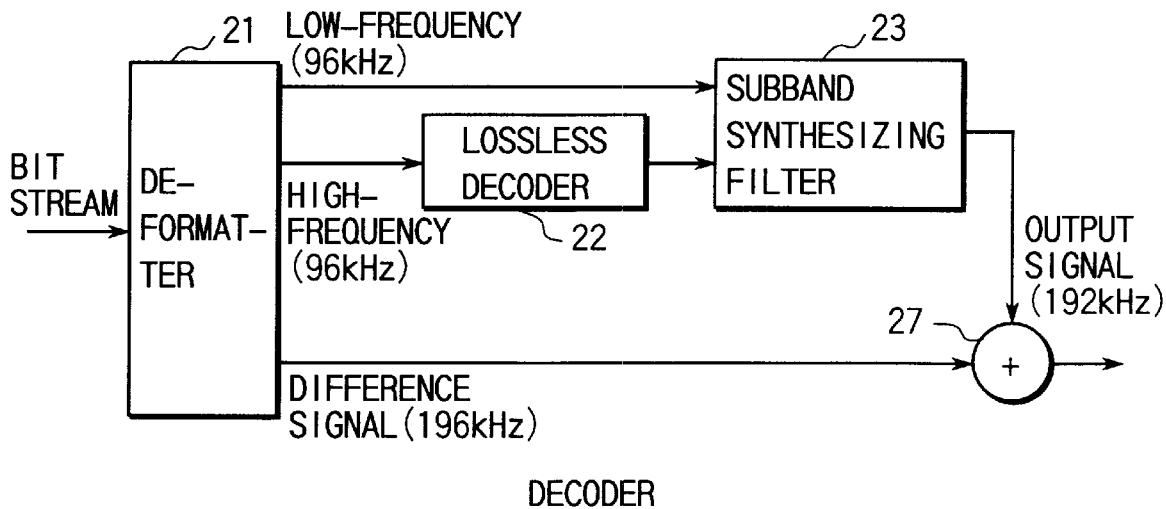
F I G. 1 5 B

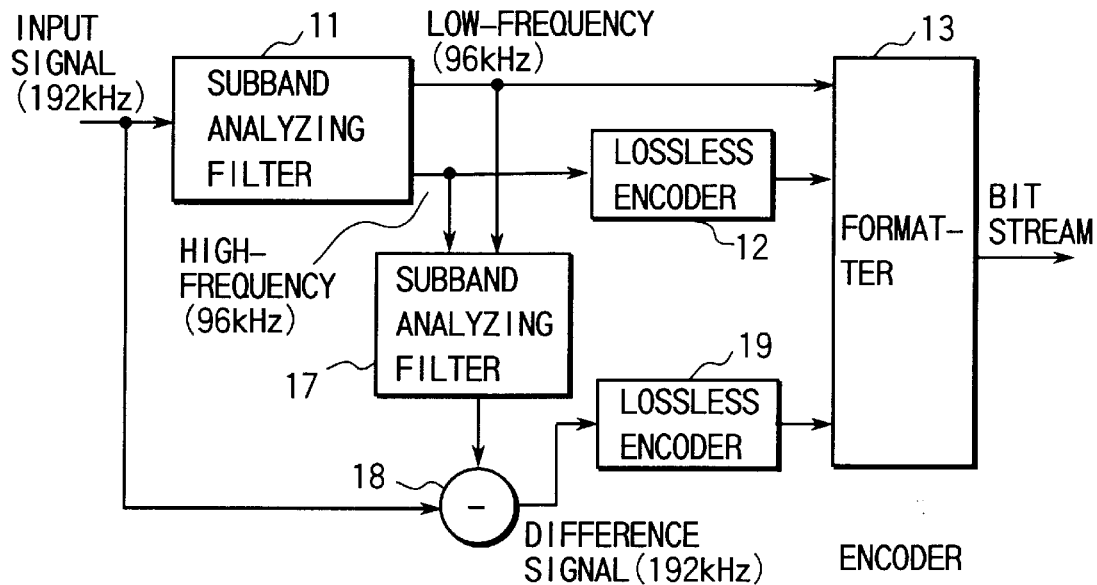
F I G. 16 A
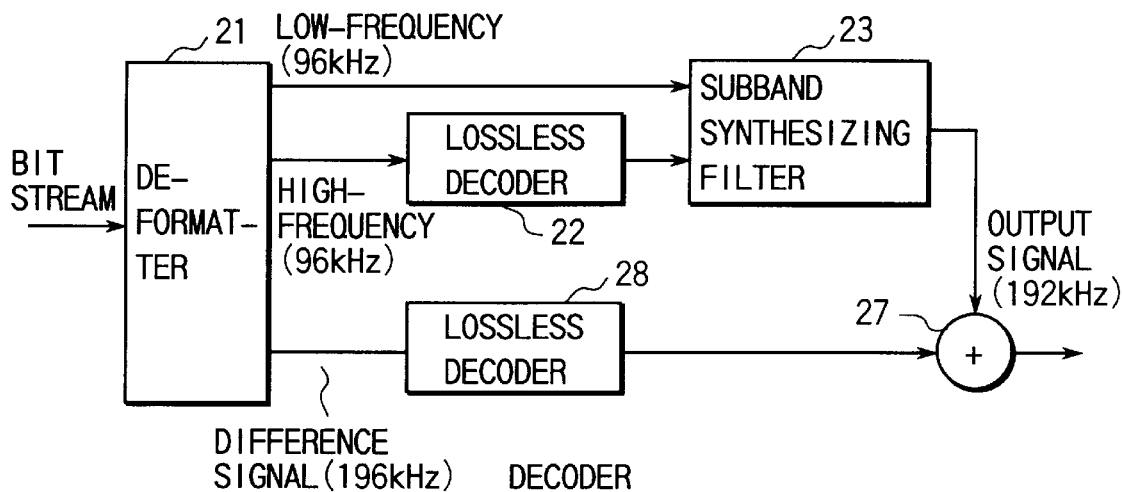
F I G. 16 B

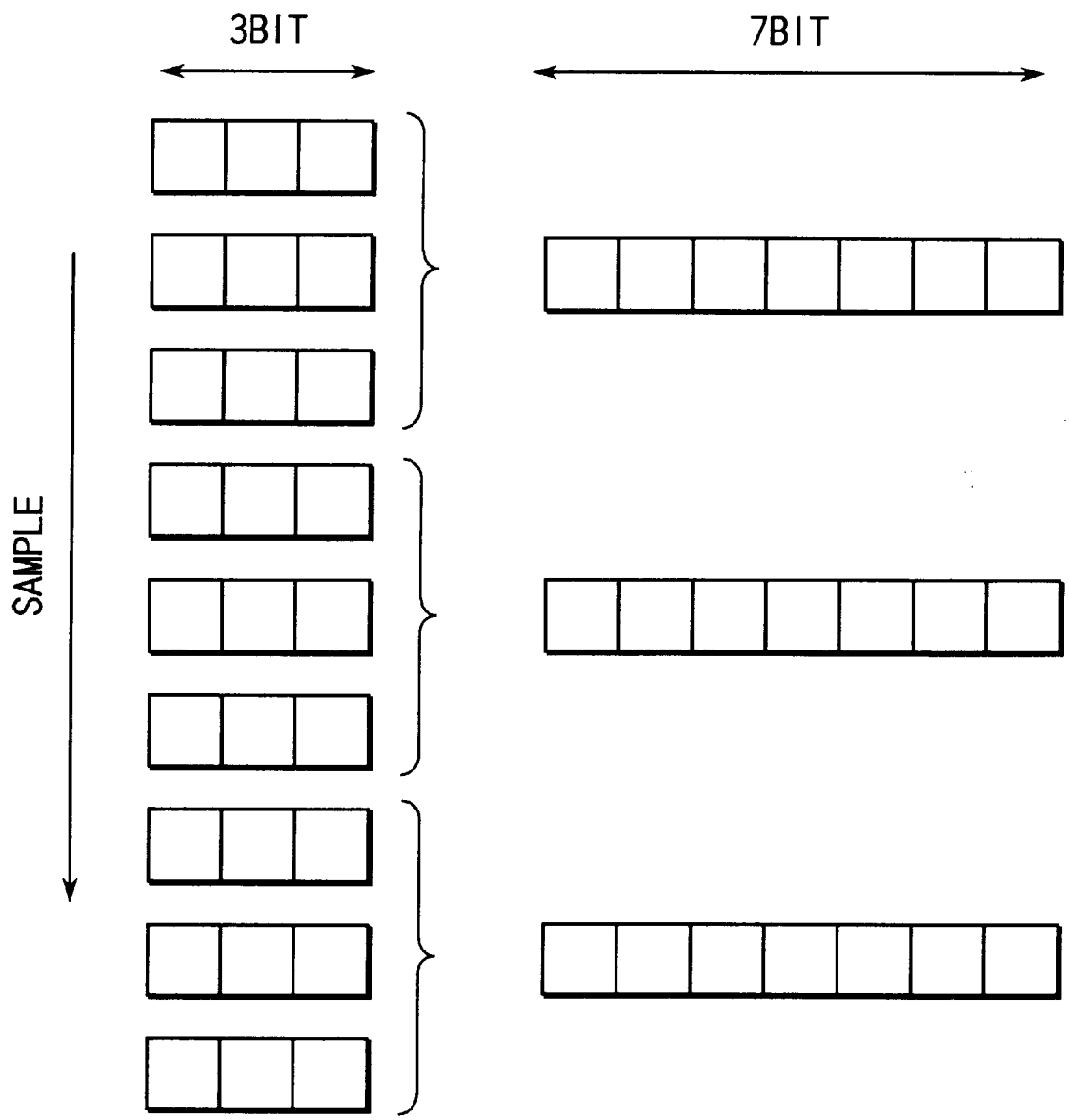
F I G. 17 A  F I G. 17 B

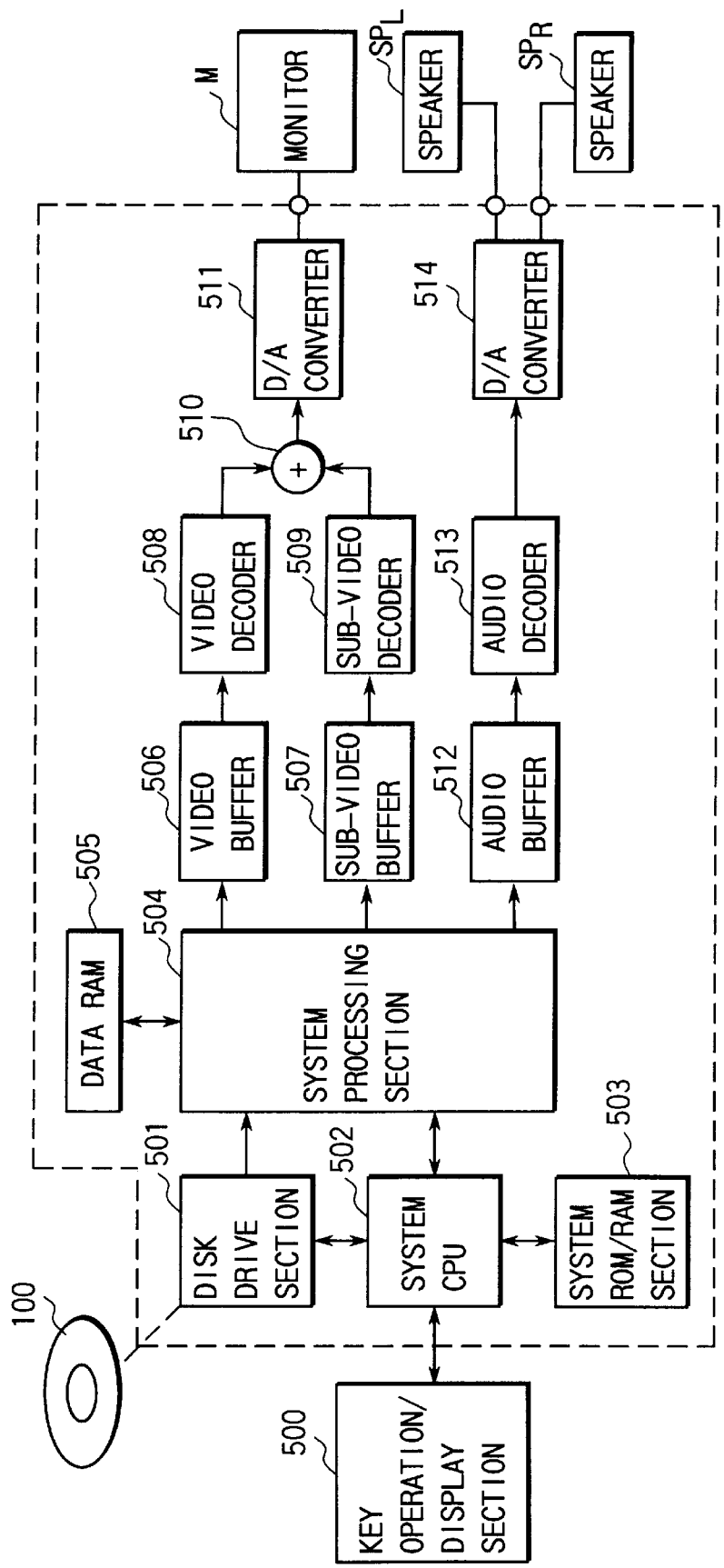
F I G. 18

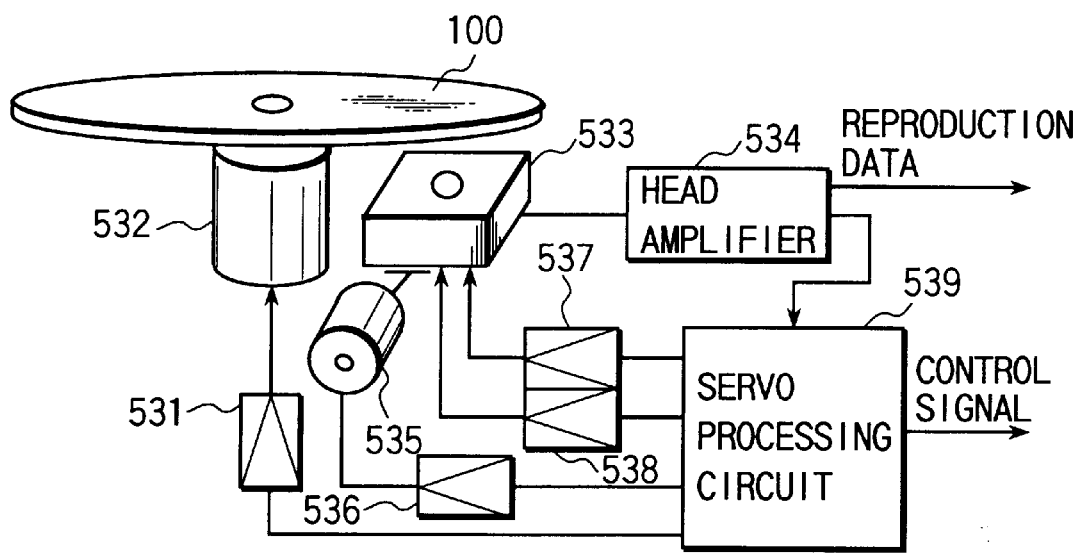
F I G. 19
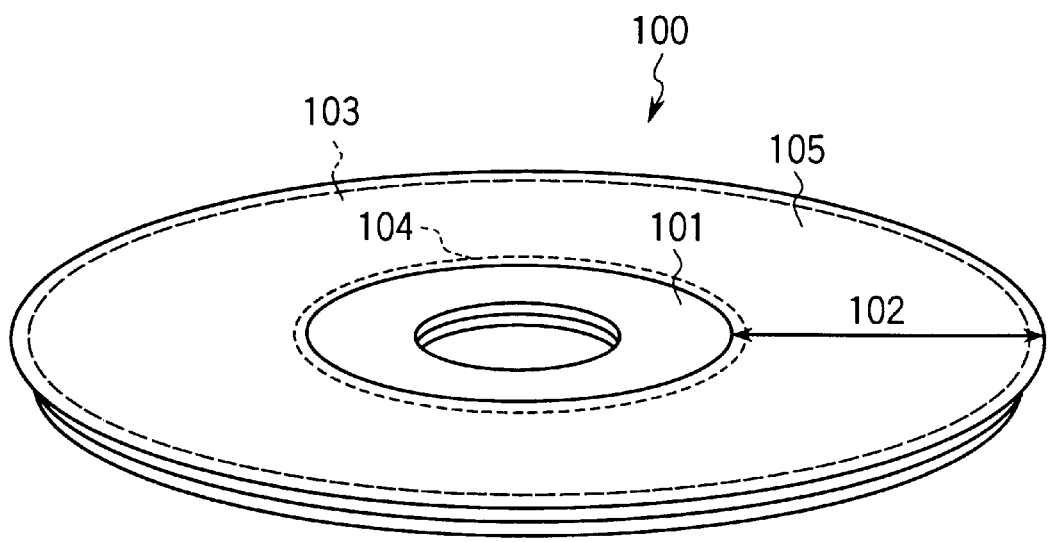
F I G. 20

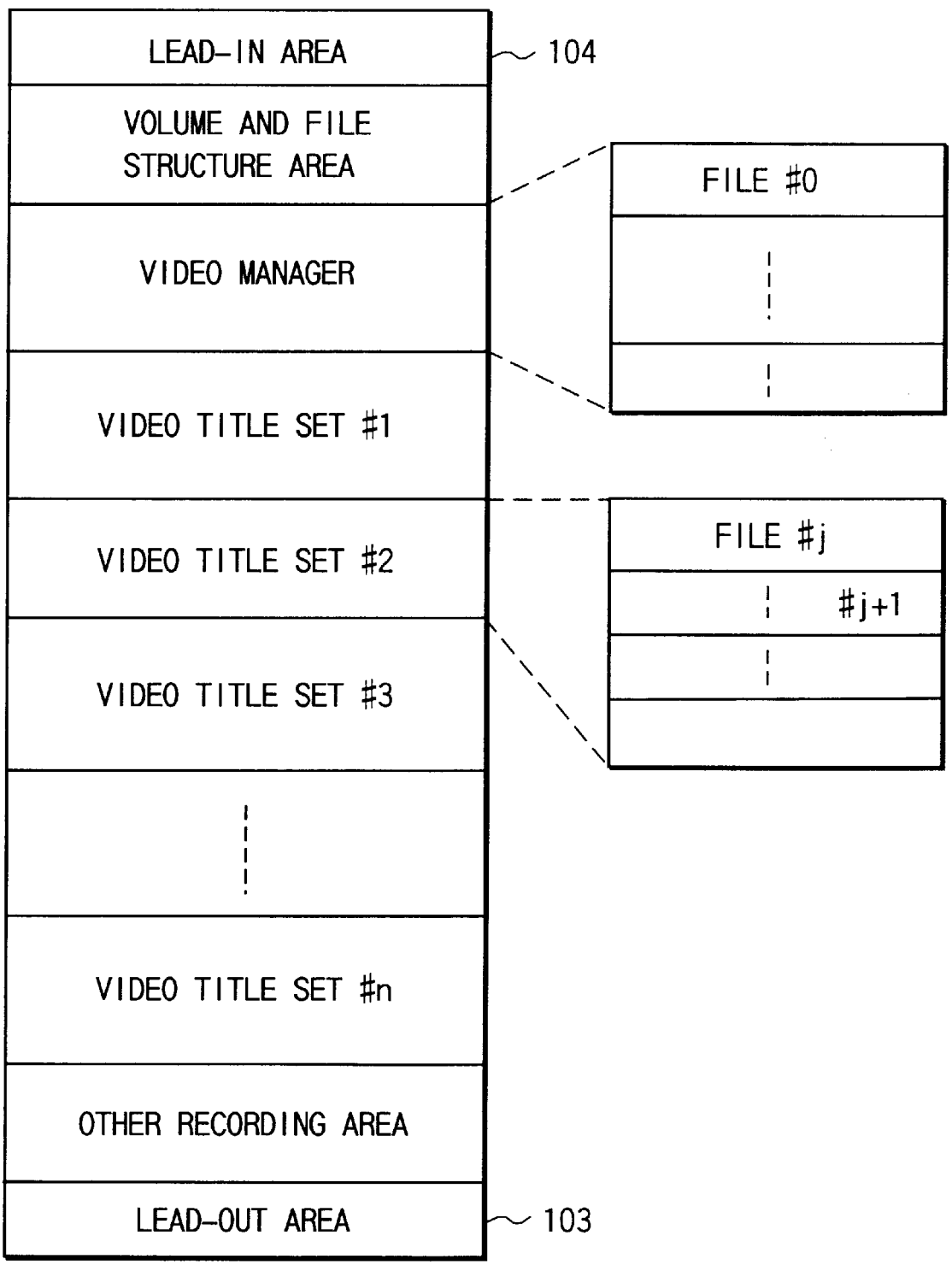
F I G. 21

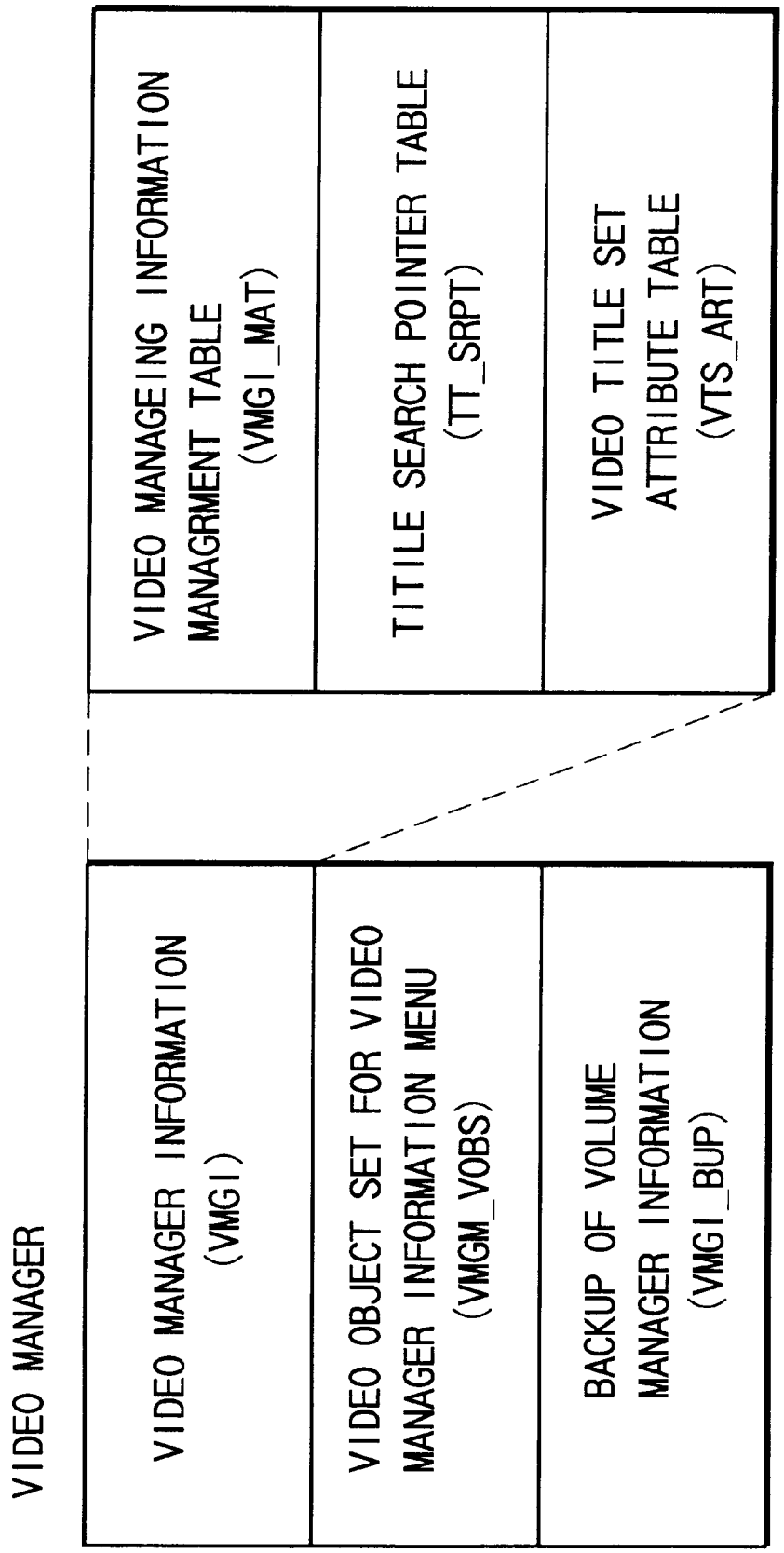
F I G. 22

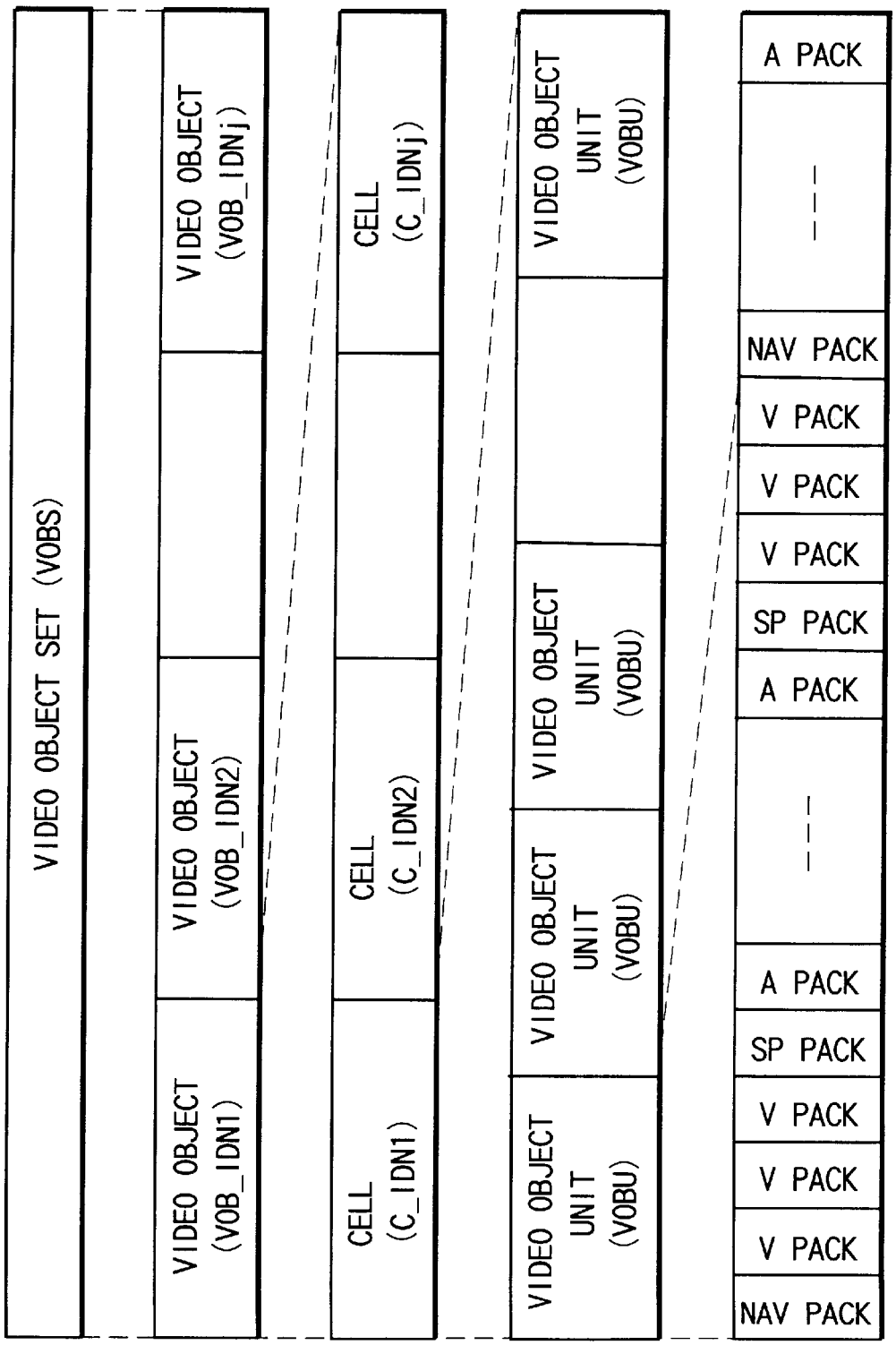
F I G. 23

DIGITAL DATA PROCESSING SYSTEM

BACKGROUND OF THE INVENTION

This invention relates to a method and apparatus for subjecting digital data to a compression coding/decoding process, and more particularly to a digital data processing system effective for transmitting or recording, or receiving or reproducing wideband digital data while maintaining the compatibility with a format dealing with narrow-band digital data by utilizing the digital data compression coding/decoding method.

More specifically, a digital data processing system according to this invention relates to a lossless compression coding method and apparatus for digital data, a decoding method and apparatus for digital data subjected to the lossless compression coding process, a transmission (recording) method and transmission (recording) apparatus for digital data subjected to the lossless compression coding process, a reception (reproducing) method and reception (reproducing) apparatus for digital data subjected to the lossless compression coding process, and a recording medium on which digital data subjected to the lossless compression coding process is recorded.

As is well known in the art, the technique for converting an audio signal into a digital form and recording and reproducing the same with respect to a recording medium is widely accepted since CDs (compact disks) were put on the market. The technique received much attention in those days as means for providing the high quality of sound (high fidelity) which could not be attained at all by using an analog record and the idea that the high fidelity can be attained by use of CDs has been fixedly accepted.

However, ten years have passed since such CDs were first put on the market and various audio devices have been developed, and now, it is widely recognized that the sound quality of such CDs is not sufficiently high as the presently available high fidelity.

Recently, a DVD (Digital Video Disk) which is a disk having the same diameter as the CD and can record digital video data and digital audio data is developed and the standardization thereof is positively considered. In the DVD, in order to record long-time digital video data and digital audio data, the digital video data and digital audio data are first subjected to the compression coding process and then recorded on the disk with high density.

In the DVD, a special attention is paid to attain the sound quality improved over that of the CD. More specifically, it is possible to record non-compressed digital audio data as well as digital audio data which is subjected to the compression coding process.

As the non-compressed digital audio data, data items ranging from data in the format in which the sampling frequency is 48 kHz and the bit width of one sample is 16 bits as in the case of CD to data in the format in which the sampling frequency is 96 kHz and the bit width of one sample is 24 bits at maximum can be dealt with. This means that the reproduction band can be increased from 20 kHz to 48 kHz and is thus widened more than two times in comparison with a case of CD and the dynamic range can be significantly improved from 98 dB to 136 dB.

However, digital audio data recorded on the present DVD is dealt with only as data attached to digital video data. Therefore, it is strongly required to develop disks exclusively used for audio data of ultra-high fidelity for dealing with digital audio data as main data and enhancing the sound quality to maximum. The concrete requirement for ultra-high sound quality is to widen the audio band to approx. 100 kHz by taking into consideration the frequency bands of various musical instruments and the frequency bands which recording devices can deal with.

In a case where disks exclusively used for audio data of ultra-high fidelity are newly developed, the compatibility with DVDs which are already standardized becomes a problem. That is, the so-called forward compatibility that a player for reproducing disks exclusively used for audio data which are newly standardized can reproduce digital audio data recorded on a previous DVD and the backward compatibility that a player for reproducing the previous DVD can reproduce disks exclusively used for audio data which are newly standardized are required.

The DVD player reproduces disks exclusively used for audio data within a range of the performance previously standardized in the function and sound quality. More specifically, even when digital audio data of 100 kHz is recorded, the DVD player can reproduce components of up to 48 kHz bandwidth.

For the forward compatibility, it is more preferable if the disk formats of the disk exclusively used for audio data and the DVD are common, but basically, it is possible to design the player for disks exclusively used for audio data so as to cope with reproduction for both of the above disk formats.

For the backward compatibility, the DVD player of the previous standard cannot recognize the newly standardized format, and therefore, it is necessary to carefully design the newly standardized format of disks exclusively used for audio data.

Further, since a required bit capacitance and the bit rate used increase in non-compressed digital audio data in which the band is wide and the bit width of one sample is large, it is difficult to record long-term data even when data is recorded on the disk with extremely high density.

Specifically speaking, the bit rate of 24-bit digital data in which the sampling frequency is 192 kHz and the bit width of one sample is 24 bits corresponds to six times the bit rate of 16-bit digital data in which the sampling frequency is 48 kHz and the bit width of one sample is 16 bits as in the case of CD.

For this reason, it becomes necessary to save the number of data bits in order to record long-term digital audio data on the disk, and as a result, it becomes necessary to subject the digital audio data to a compression coding process.

As compression coding processing means, a compression coding process which causes a deterioration in the sound quality in principle is not used, but a so-called lossless compression coding (lossless coding) process capable of completely reproducing data prior to the compression coding at the time of decoding without causing any deterioration in information in the course of compression coding is required for the purpose of attaining ultra-high fidelity.

BRIEF SUMMARY OF THE INVENTION

An object of this invention is to provide a lossless data compression coding method and apparatus and a decoding method and apparatus therefor.

Another object of this invention is to provide a transmission (recording) method and transmission (recording) apparatus for transmitting (recording) digital data of wide band while maintaining the compatibility with the format dealing with digital data of narrow band by use of the lossless data compression coding and decoding methods.

Still another object of this invention is to provide a reception (reproducing) method and reception (reproducing) apparatus for receiving (reproducing) data transmitted (recorded) as described above.

Further, another object of this invention is to provide a recording medium on which data formatted as described above is recorded.

In order to attain the above object, a lossless compression coding method of digital data according to this invention comprises a first step of dividing a digital data string input in the unit of sample constructed by a preset number of bits into block units constructed by a plurality of samples; a second step of removing a constant number of bits having a common value from each sample starting from the sign bit side thereof for all of the samples in each block obtained in the first step; and a third step of attaching information items each indicating the number of removed bits to respective compressed blocks obtained in the second step.

A lossless compression coding apparatus of digital data according to this invention comprises first means for dividing a digital data string input in the unit of sample constructed by a preset number of bits into block units constructed by a plurality of samples; second means for removing a constant number of bits having a common value from each sample starting from the sign bit side thereof for all of the samples in each block obtained in the first means; and third means for attaching information items each indicating the removed bit number to respective compressed blocks obtained in the second means.

Further, a digital data decoding method according to this invention for dealing with coded data obtained by dividing a digital data string transmitted in the unit of sample constructed by a preset number of bits into block units constructed by a plurality of samples, removing a constant number of bits having a common value from each sample starting from the sign bit side thereof for all of the samples in each block to form compressed blocks, and attaching block side information items each indicating the removed bit number to the respective compressed blocks, comprises a first step of creating data of the removed bits based on the block side information derived from the coded data; and a second step of decoding an original block by attaching the data created in the first step to all of the samples in the compressed block.

Further, a digital data decoding apparatus according to this invention for dealing with coded data obtained by dividing a digital data string transmitted in the unit of sample constructed by a preset number of bits into block units constructed by a plurality of samples, removing a constant number of bits having a common value from each sample starting from the sign bit side thereof for all of the samples in each block to form compressed blocks, and attaching block side information items each indicating the removed bit number to the respective compressed blocks, comprises first means for creating data of the removed bits based on the block side information derived from the coded data; and second means for decoding an original block by attaching the data created in the first means to all of the samples in the compressed block.

Further, a digital data transmitting method according to this invention comprises a first step of dividing input digital data into a low-frequency signal and a high-frequency signal; a second step of subjecting the high-frequency signal obtained in the first step to a lossless compression coding process; and a third step of converting the high-frequency signal subjected to the lossless compression coding process in the second step and the low-frequency signal obtained in the first step into a transmission format.

Further, a digital data transmitting apparatus according to this invention comprises a subband analyzing filter for dividing input digital data into a low-frequency signal and a high-frequency signal; coding means for subjecting the high-frequency signal output from the subband analyzing filter to a lossless compression coding process; and a formatter for converting the high-frequency signal subjected to the lossless compression coding process by the coding means and the low-frequency signal output from the subband analyzing filter into a transmission format.

Further, a digital data receiving method according to this invention for dealing with transmission data obtained by dividing digital data into a low-frequency signal and a high-frequency signal and converting the low-frequency signal and a signal obtained by subjecting the high-frequency signal to a lossless compression coding process into a transmission format, comprises a first step of separating the transmission data into a low-frequency signal and a high-frequency signal; a second step of subjecting the high-frequency signal obtained in the first step to a decoding process corresponding to the lossless compression coding process; and a third step of synthesizing the high-frequency signal obtained in the second step and the low-frequency signal obtained in the first step.

Further, a digital data receiving apparatus according to this invention for dealing with transmission data obtained by dividing digital data into a low-frequency signal and a high-frequency signal and converting the low-frequency signal and a signal obtained by subjecting the high-frequency signal to a lossless compression coding process into a transmission format, comprises a de-formatter for separating the transmission data into a low-frequency signal and a high-frequency signal; decoding means for subjecting the high-frequency signal output from the de-formatter to a decoding process corresponding to the lossless compression coding process; and a subband synthesizing filter for synthesizing the high-frequency signal output from the decoding means and the low-frequency signal output from the de-formatter.

Further, a digital data recording medium according to this invention on which data obtained by dividing digital data into a low-frequency signal and a high-frequency signal and converting the low-frequency signal and a signal obtained by subjecting the high-frequency signal to a lossless compression coding process into a transmission format is recorded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a flowchart for illustrating the procedure of the lossless coding process in the first embodiment;

FIGS. 5A and 5B are a diagram and flowchart for illustrating a second embodiment of a digital data processing system according to this invention;

FIGS. 6A and 6B are a flowchart and diagram for illustrating a modification of the second embodiment;

FIGS. 7A and 7B are diagrams for illustrating a third embodiment of a digital data processing system according to this invention;

FIGS. 8A and 8B are diagrams for illustrating a modification of the third embodiment;

FIGS. 9A and 9B are diagrams for illustrating another modification of the third embodiment;

FIGS. 11A and 11B are block construction diagrams for illustrating a fourth embodiment of a digital data processing system according to this invention;

FIGS. 12A and 12B are block construction diagrams for illustrating a difference encoder and a difference decoder in the fourth embodiment in detail;

FIGS. 13A and 13B are diagrams for illustrating a fifth embodiment of a digital data processing system according to this invention;

FIGS. 14A and 14B are block construction diagrams for illustrating a sixth embodiment of a digital data processing system according to this invention;

FIGS. 15A and 15B are block construction diagrams for illustrating a seventh embodiment of a digital data processing system according to this invention;

FIGS. 16A and 16B are block construction diagrams for illustrating an eighth embodiment of a digital data processing system according to this invention;

FIGS. 17A and 17B are diagrams for illustrating a group coding process in the eighth embodiment;

FIG. 18 is a block construction diagram for illustrating an optical disk reproducing apparatus to which this invention is applied;

FIG. 19 is a block construction diagram for illustrating a disk drive portion in the optical disk reproducing apparatus of FIG. 18 in detail;

FIG. 20 is a perspective view for illustrating the structure of an optical disk reproduced by use of the optical disk reproducing apparatus of FIG. 18;

FIG. 21 is a diagram for illustrating the logical format of a data recording area in the optical disk;

FIG. 22 is a diagram for illustrating the video manager in the logical format;

FIG. 23 is a diagram for illustrating a video object set in the video manager.

DETAILED DESCRIPTION OF THE INVENTION

Figure 1A:
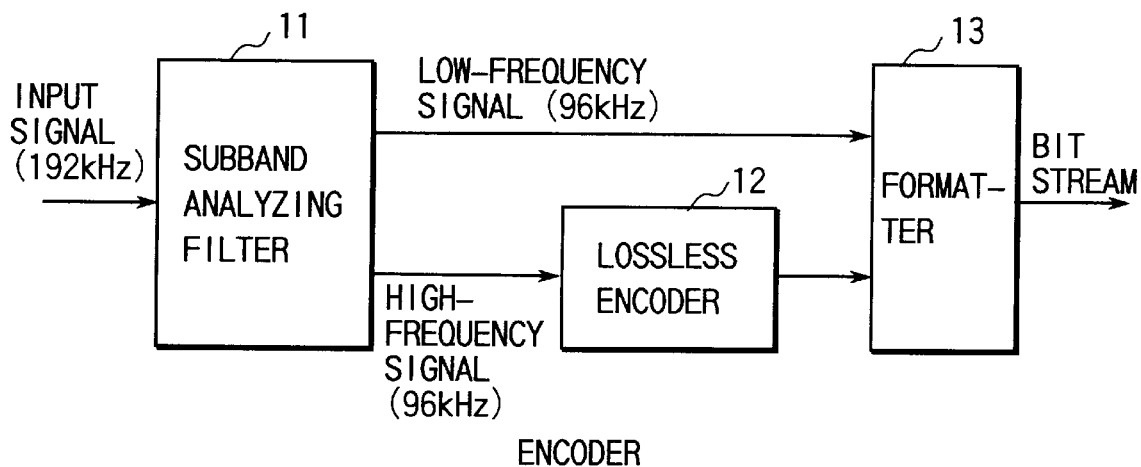
FIGS. 1A and 1B are block construction diagrams for illustrating a first embodiment of a digital data processing system according to this invention.
Figure 1B:
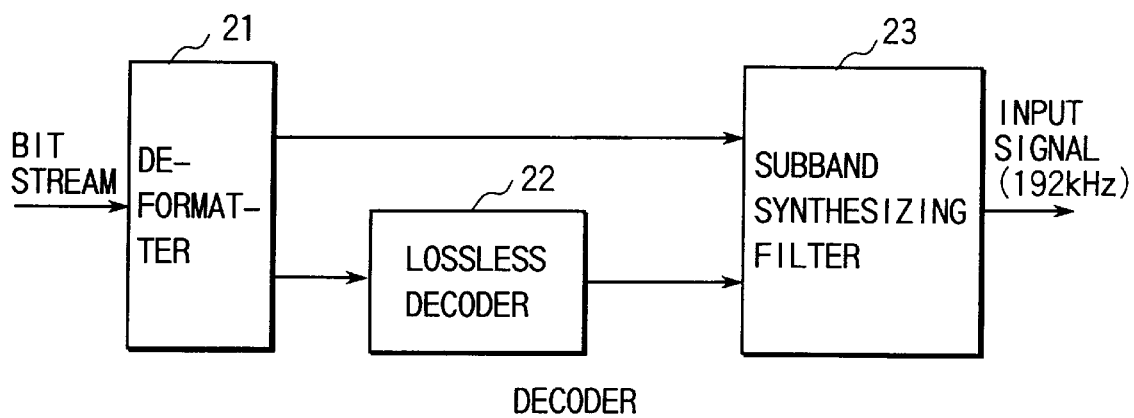

There will now be described an embodiment of this invention in detail with reference to the accompanying drawings. FIGS. 1A and 1B show the basic construction of a digital data processing system. As shown in FIG. 1A, digital audio data of wide band is supplied to a subband analyzing filter 11 as an input signal.

Assume that the sampling frequency of the digital audio data is 192 kHz. Further, in the first embodiment, audio data is taken as an example, but data to be dealt with is not limited to audio data and various types of information items can be used.

The subband analyzing filter 11 divides the bandwidth of an input signal into two bandwidths of high frequency band and low frequency band and reduces the number of output samples in the respective bandwidths to create a high-frequency signal and a low-frequency signal having a sampling frequency of 96 kHz.

Among them, the high-frequency signal is supplied to a lossless encoder 12 and subjected to the data compression process to make a high-frequency signal stream. The low-frequency signal is used as a low-frequency signal stream as it is. The low-frequency signal stream and the high-frequency signal stream are supplied to a formatter 13 and converted into a bit stream corresponding to a format for transmission or recording.

The thus created bit stream is supplied to a de-formatter 21 as shown in FIG. 1B and a low-frequency signal stream and a high-frequency signal stream are derived. Among them, the high-frequency signal stream is supplied to a lossless decoder 22 and decoded into an original non-compressed high-frequency signal and then supplied to a subband synthesizing filter 23.

The low-frequency signal stream is supplied to the subband synthesizing filter 23 as a low-frequency signal as it is. Then, the subband synthesizing filter 23 creates an output signal having a sampling frequency of 192 kHz and an original wide bandwidth based on the input high-frequency signal and low-frequency signal.

In the above digital data processing system, it is required that an input signal completely coincide with an output signal obtained by dividing the input signal into signal components of different frequency bands by the subband analyzing filter 11 and synthesizing the divided signal components by the subband synthesizing filter 23. That is, a condition that the input signal and the output signal must completely coincide with each other, that is, a condition of perfect reproduction is imposed on the characteristics of the subband analyzing filter 11 and subband synthesizing filter 23.

As the filter having the above characteristic, a quadrature mirror filter (QMF) is known. However, since the precision of the operation of the filter or the bit width of a signal divided into frequency bands for each sample is limited in practice, the perfect reproduction cannot be attained and some error is contained in the output signal. However, since the error can be suppressed to approx. 1 LSB (Least Significant Bit), sufficiently high precision can be attained from the viewpoint of the sound quality.

Figure 2A:
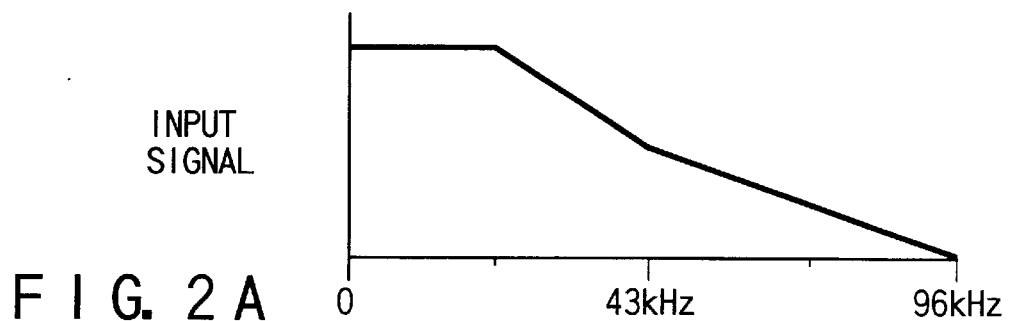
FIGS. 2A to 2D are diagrams showing the frequency spectra of signals for illustrating the characteristic of a subband analyzing filter in the first embodiment.

FIGS. 2A to 2D show the characteristic of the subband analyzing filter 11. FIG. 2A shows the frequency spectrum of the input signal. In this case, the sampling frequency of the input signal is set to 192 kHz. Further, the frequency spectrum indicates the general property of digital audio data that the signal energy becomes smaller as the frequency becomes higher.

Figure 2B:
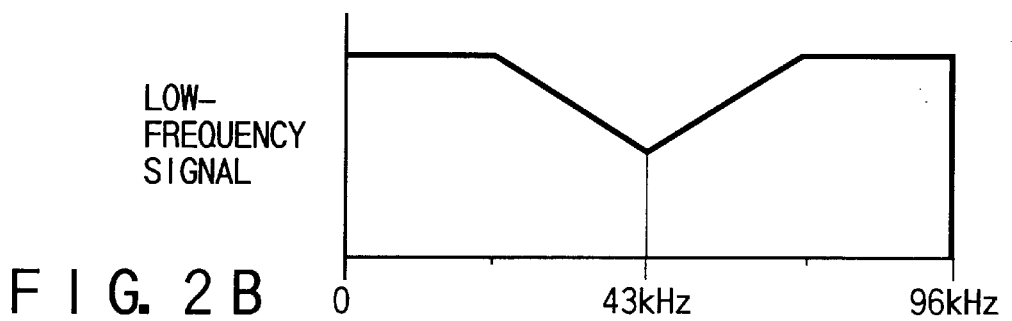
Figure 2C:
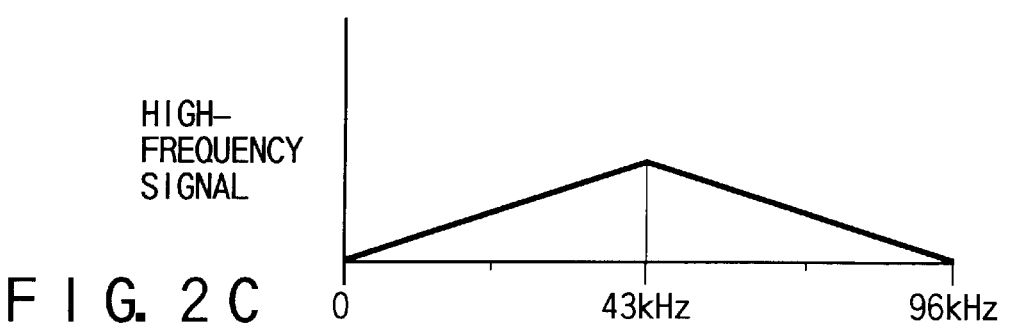

FIG. 2B shows a low-frequency signal divided into the subband by the subband analyzing filter 11. FIG. 2C shows a high-frequency signal divided into the subband by the filter 11. In this case, the sampling frequencies of the low-frequency signal and high-frequency signal are both set to 96 kHz which is half of 192 kHz. In each of the low-frequency signal and high-frequency signal, a component having a sampling frequency equal to or higher than 48 kHz which is half of 96 kHz is obtained as a signal derived by effecting the folding-copying operation for the signal in the range of 0 Hz to 48 kHz based on the principle of Nyquist.

In this case, in the high-frequency signal, a signal component from 48 kHz to 96 kHz of the input signal shown in FIG. 2A is folded over the frequency band of 0 Hz to 48 kHz. Therefore, for example, even if the high-frequency signal is reproduced as PCM (Pulse Code Modulation) data, it cannot be heard as an audio signal.

Figure 2D:
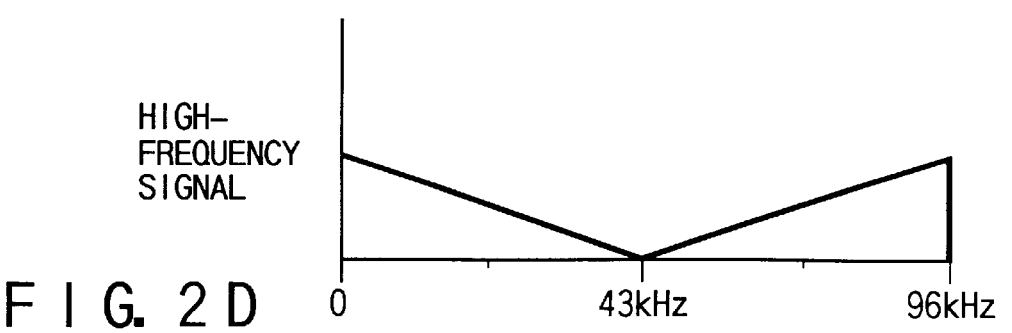

Therefore, as will be described later in detail, the high-frequency signal is converted into a frequency spectrum as shown in FIG. 2D. On the other hand, if the low-frequency signal is reproduced as PCM data which is limited to half the original frequency band of the input signal, it can be heard as an audio signal.

Based on the above condition, it becomes possible to attain the compatibility between the wide-band signal format and the narrow-band signal format. More specifically, it becomes possible to attain the compatibility between the DVD and the newly standardized disk exclusively used for audio. That is, in the DVD, sampling frequencies of 48 kHz and 96 kHz are prepared as a format dealing with non-compressed PCM data in addition to data of low bit rate compression using acoustic psychological models and 16, 20 and 24 bits are prepared as the bit width of one sample.

If the low-frequency signal obtained by dividing the wide-band signal having the sampling frequency of 192 kHz by the subband analyzing filter 11 is recorded in the DVD format on the disk, the DVD player can reproduce the recorded low-frequency signal as digital audio data having the sampling frequency of 96 kHz without causing any problem.

Since the high-frequency signal cannot be processed at all by the DVD player, it is necessary to make a format on the DVD so as to cause the DVD player to neglect the high-frequency signal. As a concrete means for making a format on the DVD so as to cause the DVD player to neglect the high-frequency signal, it is considered to set the high-frequency signal by use of a new flag, ID (Identification Data) or the like on the format of the DVD.

In order to serve the above purpose, many methods can be provided. As a simple example, it is a common practice to allot a new value which specifies the high-frequency signal stream in the ID which specifies the type of stream such as non-compressed audio data or non-compressed PCM data.

On the other hand, in a player for newly standardized disks exclusively used for audio data, if the low-frequency signal and high-frequency signal are derived by recognizing both of the ID of the non-compressed PCM data and the ID newly allotted to the high-frequency signal and the high-frequency signal is decoded and expanded to reproduce the original wideband signal by use of the subband synthesizing filter 23, audio data of ultra-high fidelity higher in sound quality than data of the DVD can be reproduced.

The lossless coding/decoding (lossless compression/reproduction) process by the lossless encoder 12 and the lossless decoder 22 is a process capable of completely reproducing original data prior to compression in the unit of bit without causing any loss when digital data is compressed and decoded and is indispensable in order to attain the ultra-high fidelity. The lossless coding/decoding process is explained below.

Figures 3A, 3B:
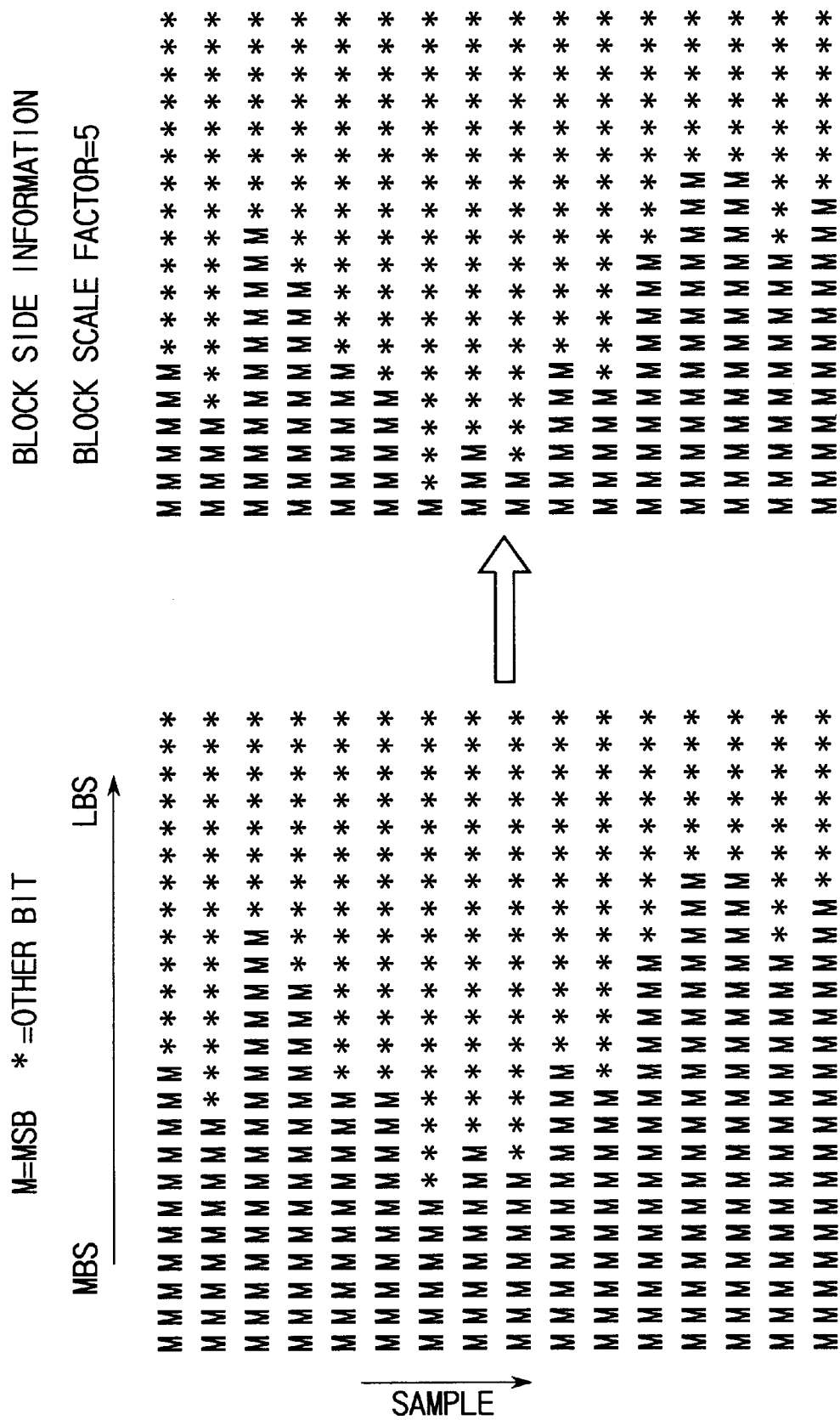
FIGS. 3A and 3B are diagrams for illustrating the lossless coding process in the first embodiment.

FIG. 3A shows a series of samples of one block obtained by dividing a series of input samples into a plurality of blocks which are each constructed by a plurality of samples. That is, 16 samples are arranged in a direction from top to bottom in the drawing and each sample is constructed by 24 bits. Each of the samples has an MSB (Most Significant Bit) which is a sign bit on the left end and an LSB on the right end in the drawing.

Further, in FIG. 3A, the MSB in each of the samples in one block is indicated by "M" and bits having the same value as the MSB in a direction from the 2SB to the LSB are also indicated by "M". In each of the samples, bits after the bit value is changed from "M" are indicated by "*" to the LSB. In this example, the number of successive bits "*" directly indicates the signal level of the sample.

That is, in a sample having a higher signal level, the bit value is changed from "M" to "*" in the upper bit position nearer to the MSB. In this case, the bits "*" continue from the 2SB to the LSB at the maximum. In a sample having a lower signal level, the bit value is changed from "M" to "*" in the lower bit position nearer to the LSB and the number of successive bits "*" becomes small. In other words, in a signal of lower level, the number of successive bits "M" becomes larger.

The bits "M" indicate bits having the same value as the MSB. Therefore, if the minimum number of successive bits "M" continuing from the MSB is derived in all of the samples of one block, bits of a number obtained by subtracting 1 from the derived number can be removed in all of the samples.

That is, in the example of the block shown in FIG. 3A, 5 bits lying on the left side of a vertical line can be removed. As the result of removal of the bits, a sample series shown in FIG. 3B is obtained. Of course, information indicating the number of removed bits becomes necessary when the original block is decoded. The information is attached to the sample series for each block as a block scale factor and transmitted or recorded.

Therefore, at the time of decoding, the number of removed bits can be recognized on the player side by reproducing the block scale factor. Then, the original sample series can be completely restored by copying and attaching the value of the MSB of each sample reproduced by the player to the MSB side of a corresponding sample by a number equal to the number of removed bits.

Various methods can be considered as the transmission method and recording method for the block scale factor. For example, it is possible to attach the block scale factor as an information section for each block or transmit or record a group of block scale factors of a plurality of blocks as a control information block.

Generally, the signal energy of the high-frequency signal level gradually decreases as shown in FIG. 2A. Particularly, in the frequency band exceeding 50 kHz, the level becomes extremely low. Then, as described before, the high-frequency signal sample becomes a sample having a small number of successive bits "*" or a large number of successive bits "M".

Therefore, by using the lossless coding process shown in FIGS. 3A and 3B, it becomes possible to significantly reduce the data amount. In the example of the lossless coding process shown in FIGS. 3A and 3B, the block scale factor used as block side information attached to the compressed block is 5, that is, the number of removed bits is 5.

FIG. 4 is an actual processing flowchart for creating a compressed block by the lossless coding process of the lossless encoder 12. First, when the process is started, the lossless encoder 12 fetches samples of a processing block in the step S11 and checks the numbers of successive MSBs of the respective samples and determines the smallest one of the numbers in the step S12.

After this, the lossless encoder 12 determines the reduced number of bits in the step S13, effects the compression process for the respective samples according to the reduced number of bits in the step S14, attaches block side information (block scale factor) in the step S15 and completes creation of the compressed block.

FIG. 5A shows a second embodiment of this invention. In this embodiment, the compressed block which is created by the compression process shown in FIGS. 3A and 3B and in which the block scale factor as block side information is set to 5 is divided into a plurality of subblocks and an attempt is made to reduce the number of MSBs in each of the subblocks. In this case, the subblock size is attached as block side information for each block in addition to the block scale factor.

That is, in the case of compression process shown in FIG. 5A, the block scale factor 5 and subblock size 4 are attached to the compressed block as block side information. In this case, the subblock size 4 indicates that the subblock is constructed by 4 samples. Further, the subblock scale factor is attached to each subblock as additional information.

In the above case, bits of each sample can be reduced by a number equal to the sum of the reduced number of bits indicated by the block scale factor and the reduced number of bits indicated by the subblock scale factor. Further, at the time of decoding, the original data can be completely reproduced by reading out each additional information, calculating the reduced number of bits, and expanding the MSBs by the reduced number of bits in each sample based on the result of calculation.

The lossless coding means shown in the second embodiment is effective for further enhancing the data reducing efficiency. That is, in the lossless coding means shown in the first embodiment, when the block size of one block to be compressed is set to a large value and if at least one sample having a high level is present in the block, the reduced number of bits is determined only by the sample, and as a result, it becomes difficult to sufficiently enhance the data reduction efficiency.

On the other hand, if the block size of one block to be compressed is set to a small value, the number of data bits can be partially reduced to a great extent, but since the number of block scale factors indicating the reduced number of bits increases and the bit length must be elongated, the efficiency of compression of data containing block side information will not be enhanced.

However, as in the second embodiment, the more efficient data compression can be attained by first reducing the amount of data in the block of large size and then effecting the compression coding process according to a partial variation in data in each of the subblocks.

FIG. 5B is an actual processing flowchart for creating a compressed block by the lossless coding process explained in the second embodiment. First, when the process is started, the lossless encoder 12 fetches samples of a processing block in the step S16, checks the numbers of successive MSBs of the respective samples and determines the smallest one of the numbers in the step S17, and determines the reduced number of bits in the step S18.

After this, the lossless encoder 12 divides the processing block into a plurality of subblocks in the step S19 and determines the reduced number of bits of each subblock in the step S20. Then, the lossless encoder 12 effects the compression process for the samples according to the reduced numbers of bits of the block and subblock in the step S21, attaches subblock side information in the step S22 and attaches block side information in the step S23 so as to complete creation of the compressed block.

FIG. 6A shows a modification of the second embodiment and is a flowchart for illustrating an example of the operation for determining the size of a subblock. In short, the subblock size is not necessarily unconditionally determined and may be changed.

That is, the signal level may change slowly in some cases and change rapidly in other cases. Therefore, the compression process for various types of signals can be more efficiently effected by adequately changing the subblock size according to the property of the signal.

In FIG. 6A, when the block compression is effected and the process is started, the lossless encoder 12 sets the first subblock size in the step S24 and determines a scale factor for each subblock in the step S25. After this, the lossless encoder 12 effects the compression coding process for data containing side information with the subblock size and then counts the total number of bits in the step S26.

Then, the lossless encoder 12 changes the block size in the step S27 and determines whether the process for changing the sizes of all of the blocks is effected or not in the step S28. When it is determined that the process for changing the sizes of all of the blocks is not completed (the result of determination is "NO"), the process of the lossless encoder 12 is returned to the step S25 and the same compression coding process for each subblock is effected.

Further, if it is determined in the step S28 that the process for changing the sizes of all of the blocks is completed (the result of determination is "YES"), the lossless encoder 12 selects the block size which gives the smallest total number of bits and completes the process. After this, the subblock scale factor is determined based on the selected block size, and the sample compression is effected and side information is attached.

Further, although not shown here, if the number of bits representing the subblock scale factor is determined for each block, a more efficient compression coding process can be effected. FIG. 6B shows an example in which a sample block scale factor is used instead of the subblock scale factor in a special case wherein the subblock size is set to one (one sample).

FIGS. 7A and 7B show a third embodiment of this invention. Like the case of FIG. 6A, in the third embodiment, data is subjected to the block compression and then further subjected to the compression coding process for each sample, but the scale factor of each sample is indicated by a difference in the reduced number of bits from a preceding sample.

That is, in the example shown in FIGS. 7A and 7B, one bit is given to each sample, and if the bit is "1", it means that bits of a number equal to (the reduced bit number of the preceding sample +1) are reduced, and if the bit is "0", it means that bits of a number equal to (the reduced bit number of the preceding sample −1) are reduced. In a case where the reduced bit number becomes negative, becomes smaller than the reduced bit number indicated by the block scale factor, or exceeds a preset value, it is necessary to impose a limitation.

Further, it is necessary to provide a rule that the reduced bit number for the first block should be started from the reduced number (for example, 5 in the former example) indicated by the block scale factor. As shown in FIG. 7A, there occurs a case where the reduced bit number exceeds a reducible bit number. In such a case, it is necessary to sequentially correct in a backward direction the scale factors of the previous samples which have been processed and determine the scale factors thereof again so as not to cause the above problem. By this determination, side information of less number of bits can be used and the compression coding can be effected more efficiently.

FIGS. 8A and 8B show a modification of the third embodiment. That is, the explanation for the modification is the same as that for the case of FIGS. 7A and 7B, but in this modification, the scale factor of each sample indicates a difference in the reduced bit number by use of two bits. In this case, when the scale factor S is set to 1, 0, 2 or 3, it means that the reduced bit number of the sample is +1, ±0, −1 or −2 with respect to the reduced bit number of the preceding sample, respectively.

Also, in this case, like the former modification, when the process for determining the scale factor comes to a deadlock, it is necessary to sequentially correct in a backward direction the scale factors of the previous samples which have been processed. The number of bits of side information increases in comparison with the case of 1 bit, but the reduced bit number increases, and therefore, an efficient reduction in the number of bits can be attained.

FIGS. 9A and 9B show another modification of the third embodiment. That is, the scale factor of each sample indicates a difference in the reduced bit number by use of two bits, and when the scale factor S is set to 1, 0, 2 or 3, it means that the reduced bit number of the sample is +1, ±0, −1 or reset value with respect to the reduced bit number of the preceding sample, respectively.

The reset value indicates that the reduced bit number is reset to the reduced bit number (in this example, 5) which is indicated by the block scale factor when the scale factor determining process comes to a deadlock. By this setting, the above problem will not occur and it becomes unnecessary to effect the scale factor determining process for the same samples again, thereby making it possible to simplify the coding process and reduce the processing time.

Figure 10:
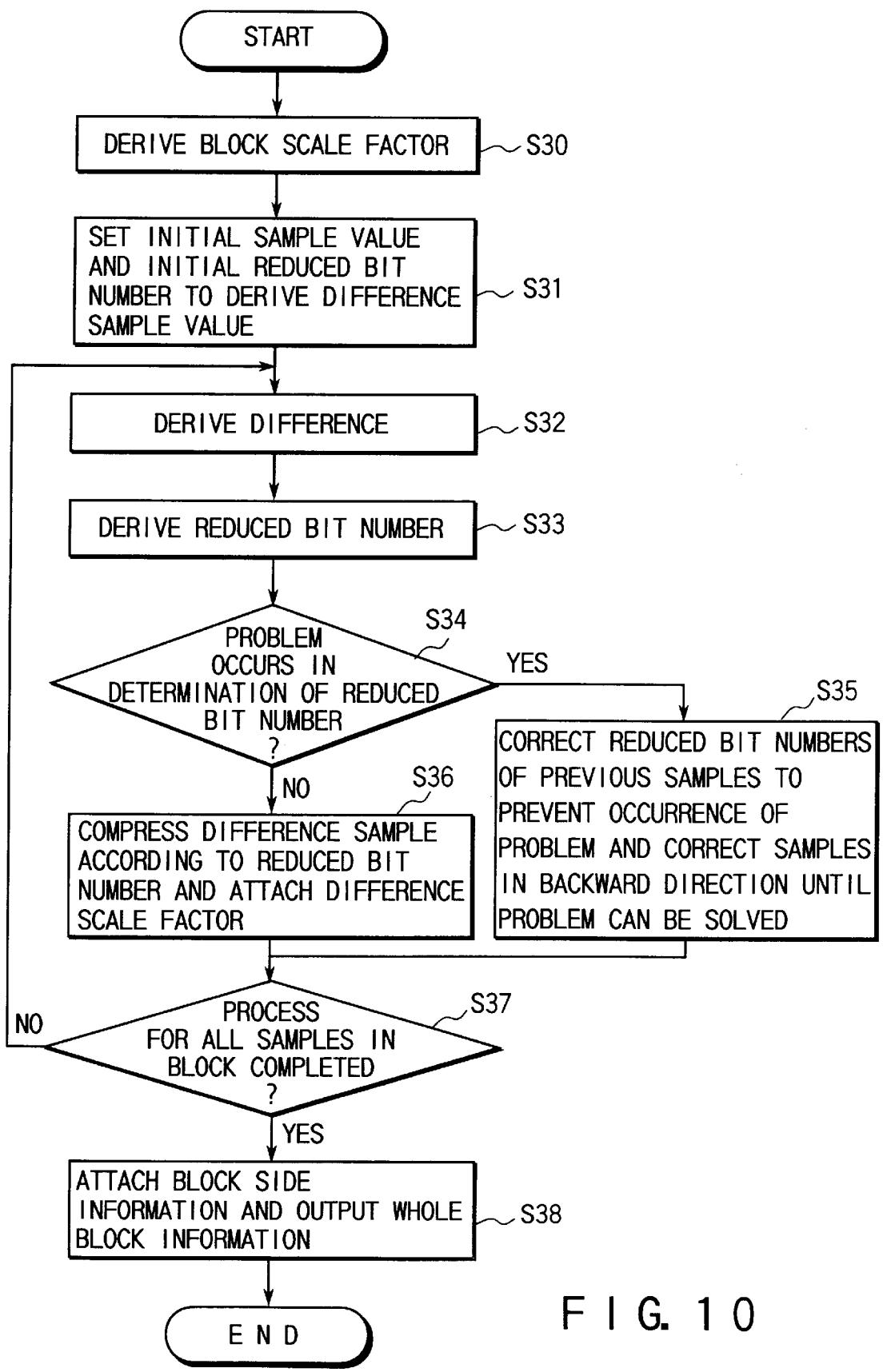
FIG. 10 is a flowchart for illustrating the procedure in the third embodiment and the modifications thereof.

FIG. 10 is a flowchart showing the actual process for effecting the process of the modifications shown in FIGS. 8A and 8B and FIGS. 9A and 9B. When the process is started, the lossless encoder 12 derives the block scale factor in the step S30 and then starts the process of the subblock.

That is, the lossless encoder 12 sets an initial sample value and an initial reduced bit number to derive a difference sample value in the step S31. In this case, the first sample of the block and the block scale factor thereof are used.

The lossless encoder 12 first derives a difference from the block scale factor in the step S32 and derives a reduced bit number based on the difference in the step S33. After this, the lossless encoder 12 checks in the step S34 whether or not a problem occurs in determination of the reduced bit number, and if it is determined that the above problem occurs (the result of determination is "YES"), the reduced bit numbers of the previous samples are corrected so as not to cause the above problem in the step S35. The correcting operation is sequentially effected in a backward direction for the previous samples until the above problem can be solved.

After the step S35, or when it is determined in the step S34 that no problem has occurred in determination of the reduced bit number (the result of determination is "NO"), the lossless encoder 12 compresses the object sample according to the reduced bit number and attaches a difference scale factor to the sample in the step S36.

The above process is effected for all of the samples in the block. Then, the lossless encoder 12 determines in the step S37 whether the process for all of the samples in the block is completed or not, and if it is determined that the process is not yet completed (the result of determination is "NO"), it effects the step S32 again.

If it is determined in the step S37 that the process for all of the samples in the block is completed (the result of determination is "YES"), the lossless encoder 12 attaches block side information and outputs whole block information in the step S38 and terminates the process.

FIGS. 11A and 11B show a fourth embodiment of this invention. In FIGS. 11A and 11B, portions which are the same as those of FIGS. 1A and 1B are denoted by the same reference numerals. In the fourth embodiment, in an encoder provided on the transmission side or recording side, a difference encoder 14 is connected in the preceding stage of the lossless encoder 12. Further, in a decoder provided on the reception side or reproducing side, a difference decoder 24 is connected in the succeeding stage of the lossless decoder 22.

That is, in order to more efficiently effect the lossless compression coding process for a high-frequency signal, a high-frequency signal is subjected to the difference coding process by the difference encoder 14 before effecting the lossless compression coding process.

The difference coding process is to transmit or record a difference from the preceding sample value instead of transmitting or recording a sample value, and as the sample value varies more slowly, the amplitude of the difference value thereof becomes smaller. For this reason, when the lossless compression coding process is effected by the lossless encoder 12, the compression process can be effected with extremely high efficiency.

As shown in FIG. 2C, the high-frequency signal is converted into a low-frequency band. In a general subband filter, the high and low frequency regions are reversed. For this reason, even though the signal energy becomes lower in the higher frequency region as shown in FIG. 2A, the signal energy will increase in the higher frequency region.

As described before, in the difference coding process, as the signal varies more slowly, that is, the frequency becomes lower, the difference value becomes smaller, but it cannot be expected that the amplitude of the difference value will become small in the case of the high-frequency signal shown in FIG. 2C.

Therefore, it becomes necessary to attain the spectrum as shown in FIG. 2D by reversing the high and low frequency regions of the frequency components or shifting the frequency component by half the sampling frequency based on the property of the discrete sampling value. This method can be attained by alternately multiplying the sample value of the high-frequency signal by +1 and −1.

This corresponds to a process for multiplying a carrier of a frequency fs/2 (sampling frequency:fs=96 kHz) and is equivalent to the frequency shift of 48 kHz. Of course, if the subband filter 11 is designed to have the frequency inverting function or frequency shifting function, the frequency inverting process or frequency shifting process in this stage becomes unnecessary.

FIG. 12A shows the difference encoder 14 in detail and FIG. 12B shows the difference decoder 24 in detail. The difference encoder 14 includes a sign inverter 141, switch 142, delay register 143 and subtracter 144. The difference encoder 24 includes an adder 241, delay register 242, sign inverter 243 and switch 244.

In the difference encoder 14, a sample of an input high-frequency signal and a signal obtained by inverting the sign of the input signal by use of the sign inverter 141 are alternately received via the switch 142. If the received signal is set to S'(n), a difference between the signal S'(n) and a signal obtained by delaying the signal by one sample by use of the delay register 143 is derived by the subtracter 144 and is output as a difference signal.

In the difference decoder 24, an input difference signal is added with an output of the register 242 which is a preceding sample of the signal subjected to the difference decoding process by use of the adder 241 and it is thus subjected to the difference decoding process. The signal subjected to the difference decoding process is stored in the delay register 242 so that it can be used for effecting the decoding process for a next sample. Further, when the frequency shifting of 48 kHz is effected for the signal subjected to the difference decoding process at the time of coding, the sample thereof itself and a sample obtained by inverting the same by use of the sign inverter 243 are alternately derived by use of the switch 244 in the same manner as in the coding process and it is used as a decoded signal.

When the signal is subjected to the difference coding process, a difference value is added to the preceding sample, and as a result, it becomes necessary to add an initial value at the starting time of the difference decoding process. Therefore, there occurs a problem that the decoding process cannot be started until the initial value is obtained, and if an error occurs in the sample value in the course of the decoding process, the decoded sample obtained after this becomes all erroneous (transmission of error).

It is considered to collect a plurality of difference samples to make a block, treat a first sample of the block not as a difference sample but as a sample value itself, use the sample as an initial sample value and treat the succeeding samples as difference sample values.

Thus, at the decoding time, the first sample of each block can be freely selected as a starting point of the decoding process. Further, even when an error occurs in the difference sample, transmission of the error can be stopped within the block. Thus, various methods of the lossless compression coding process can be applied to the signal subjected to the difference coding process.

Figures 13A, 13B:
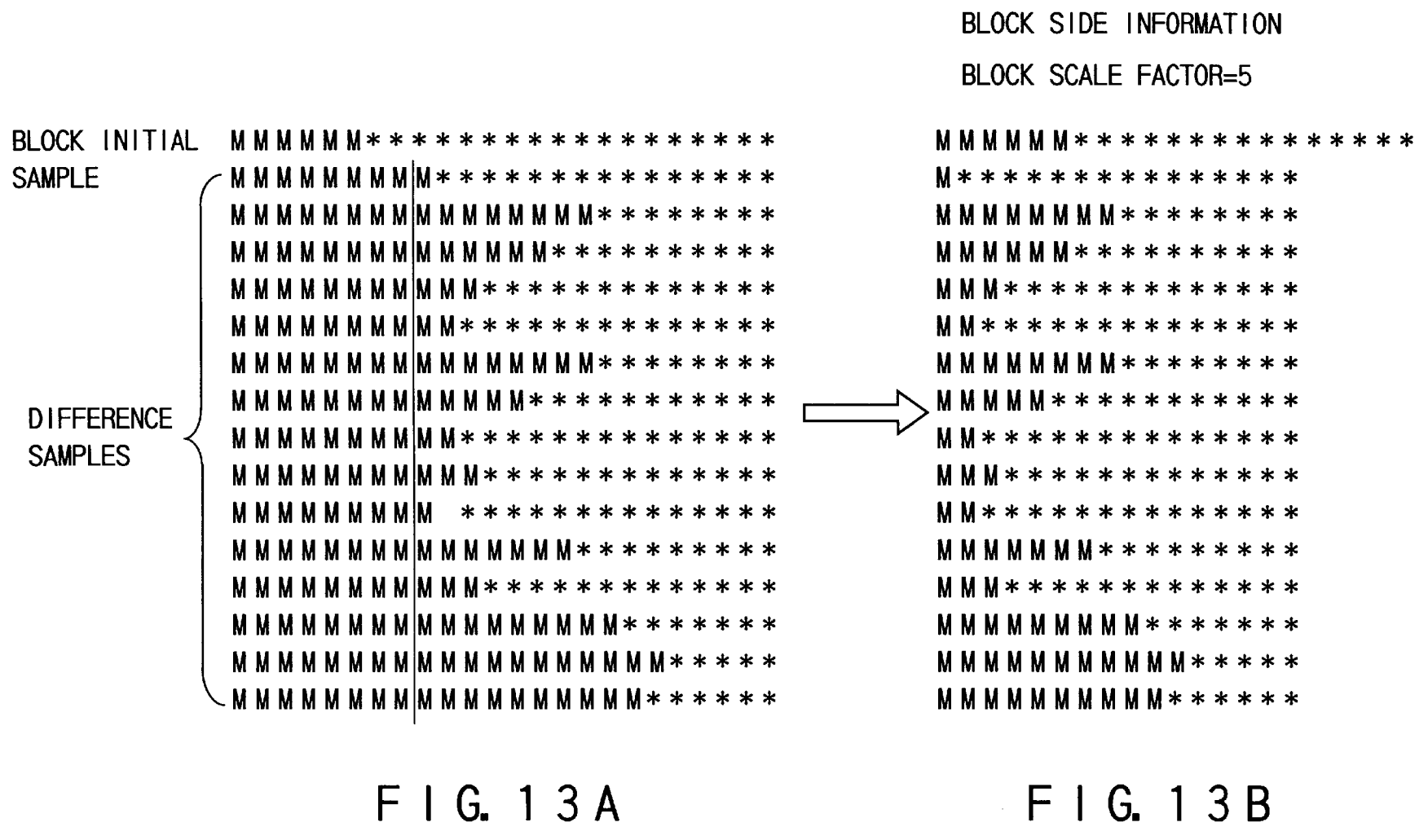

FIGS. 13A and 13B show a fifth embodiment of this invention. That is, a case wherein the block scaling is effected for the signal subjected to the difference coding process is shown. In the head portion of the block, a sample which is not a difference sample is arranged as a block initial sample.

Difference samples are arranged as the second and succeeding samples and block scales for the difference samples are derived to effect the scaling operation. As the block scaling, the subblock scaling, sample scaling or difference scaling can be applied and a more efficient compression coding process can be attained.

In each of the embodiments described above, the dividing ratio of the high-frequency bandwidth and the low-frequency bandwidth is set to 1:1, but it is clearly understood that the same effect and operation can be attained even if the dividing ratio is set to 1:3, for example. Even if the low-frequency bandwidth is divided with the ratio of 1:1 after the bandwidth of the input signal is divided with the ratio of 1:1, the lowest-frequency signal is kept unchanged and the remaining two bands are subjected to the lossless compression coding process, the same effect can be attained.

FIGS. 14A and 14B show a sixth embodiment of this invention. Portions which are the same as those of FIGS. 1A and 1B are denoted by the same reference numerals and the encoder in this embodiment additionally includes a subband analyzing filter 15 and a lossless encoder 16 provided in the low-frequency signal path between the subband analyzing filter 11 and the formatter 13.

The subband analyzing filter 15 divides a signal of 0 to 48 kHz into a low-frequency signal of 0 to 24 kHz and a high-frequency signal of 24 to 48 kHz. The high-frequency signal of 24 to 48 kHz is subjected to the lossless coding process by the lossless encoder 16 and supplied to the formatter 13.

In the decoder which is designed to correspond to the above encoder, a lossless decoder 25 and a subband synthesizing filter 26 are additionally connected to the output side of the de-formatter 21.

FIGS. 15A and 15B show a seventh embodiment of this invention. Portions which are the same as those of FIGS. 1A and 1B are denoted by the same reference numerals. In FIG. 15A, the high-frequency signal and low-frequency signal output from the subband analyzing filter 11 are supplied to and synthesized by the subband synthesizing filter 17.

Then, a difference between the input signal and a signal obtained by synthesizing in the subband synthesizing filter 17 is derived by a subtracter 18 as a difference signal (synthesized error signal). After this, the error signal, low-frequency signal stream and high-frequency stream are supplied to the formatter 13 and converted into a bit stream corresponding to a format for transmission or recording.

The thus created bit stream is supplied to the de-formatter 21 and a low-frequency signal stream, high-frequency stream and error signal are derived as shown in FIG. 15B.

Among the above signals, the high-frequency signal stream is restored into an original non-compressed high-frequency signal by the lossless decoder 22 and the non-compressed signal and low-frequency signal are synthesized by the subband synthesizing filter 23. Then, the synthesized signal is added to an error signal by an adder 27 to produce an output signal having the original wide bandwidth and a sampling frequency of 192 kHz.

In the system of the seventh embodiment, a difference signal between the input signal and the synthesized signal is previously derived on the transmission side or recording side and the difference signal is transmitted to the reception side or reproducing side, thereby making it possible to completely restore the original signal.

The sampling frequency of the high-frequency signal and low-frequency signal whose bandwidths are divided is reduced to half that of the input signal and the total sum of the sampling frequencies of the above signals becomes equal to the sampling frequency of the input signal. However, the sampling frequency of the error signal is the same as the sampling frequency of the input signal. Therefore, since the total sum of the sampling frequencies of the low-frequency signal, high-frequency signal and error signal becomes twice the sampling frequency of the input signal, it becomes important to compress data.

First, since the signal energy of the high-frequency signal is generally reduced, it can be subjected to various compression coding processes by use of the property of the high-frequency signal.

Next, the compression coding process for the error signal is explained. First, if an input signal is set as P(z), a low-frequency signal L(z) and a high-frequency signal U(z) which are expressed by the following equations can be attained by supplying the input signal P(z) to the subband analyzing filter 11.

$$L(z)=F1(z)\cdot P(z)$$

$$U(z)=F2(z)\cdot P(z)$$

After this, the low-frequency signal L(z) and high-frequency signal U(z) are supplied to the subband synthesizing filter 17 and a synthesized signal S(z) expressed as follows is obtained.

$$S(z)=G1(z)\cdot L(z)+G2(z)\cdot U(z)=\{G1(z)\cdot F1(z)+G2(z)\cdot F2(z)\}\cdot P(z)$$

In this case, in the course of the above operation, the sample extracting process or interpolating process or the like may be effected, but if a quadrature mirror filter is used, S(z) expressed as follows can be obtained.

$$S(z)=P(z)$$

However, since an error occurs in practice, the input signal P(z) and the synthesized signal S(z) will not become equal to each other. The error is caused by two factors. The first factor is a filter operation error which relates to the internal word length of an operator, that is, the hardware.

The second factor is that a signal whose bandwidth is divided is reduced to a preset word length since a relatively large amount of useless data thereof occurs if a long word length appearing as the result of the operation is transmitted or recorded as it is. Generally, the signal is reduced to the same word length as the input word length. For example, if an input signal is a 24-bit signal, two signals whose bandwidths are divided are also reduced to a length of 24 bits.

In this case, the former error relating to the hardware can be suppressed to a sufficiently small value in comparison with the error caused by the latter factor. That is, generally, the error is mainly caused by the latter factor. The amplitude of the error is approx. ±LSB at most and if the errors are set as E1(z) and E2(z), a low-frequency signal L'(z), high-frequency signal U'(z) and synthesized signal S'(z) created by taking the errors E1(z) and E2(z) into consideration can be expressed as follows.

$$L'(z)=F1(z)\cdot P(z)+E1(z)$$

$$U'(z)=F2(z)\cdot P(z)+E2(z)$$

$$S'(z)=\{G1(z)\cdot F1(z)+G2(z)\cdot F2(z)\}\cdot P(z)+\{G1(z)\cdot E1(z)+G2(z)\cdot E2(z)\}=P(z)+\{G1(z)\cdot E1(z)+G2(z)\cdot E2(z)\}$$

Then, a decoding error E(z) expressed by the following equation can be obtained.

$$E(z)=G1(z)\cdot E1(z)+G2(z)\cdot E2(z)$$

The magnitude of the decoding error E(z) depends on the characteristics G1(z), G2(z) of the subband synthesizing filter 17 and $|E(z)|<n\Delta$.

However, when n is an integer and $\Delta$ is set as a minimum quantization step (LSB), the integer n can be set to a small value in the range of approximately 1 to 3. Therefore, the error signal can be expressed by several bits at most and the amount of data can be greatly compressed. Thus, the error signal can be expressed by a small number of bits, but it is possible to further effect the data compression process.

FIGS. 16A and 16B show an eighth embodiment of this invention in which the error signal is subjected to the data compression process and portions which are the same as those of FIGS. 15A and 15B are denoted by the same reference numerals. First, as shown in FIG. 16A, on the encoder side, an error signal output from a subtracter 18 is supplied to a lossless encoder 19 and subjected to the lossless compression coding process.

As shown in FIG. 16B, on the decoder side, an error signal separated by a de-formatter 21 is subjected to the lossless compression decoding process by a lossless encoder 28 and then added to a subband synthesized signal in an adder 27. Generally, the error signal is a random signal and it is necessary to consider a method different from a method used for processing the high-frequency signal as a method for effecting the lossless compression coding process.

Now, a group coding process which is one of the lossless compression coding processes for processing the error signal is explained. For example, assume that the error signal can be expressed by only three values of +1, 0 and −1. Then, generally, the error signal is expressed by use of two bits as follows, for example.

"01" +1
"00"
"11" −1
"10"*

In this case, "10" has no meaning and is vainly used as information.

If a plurality of samples are collected and coded in a group form, the coding process can be effected by use of a less number of bits. For example, assume now that three samples are set as P(1), P(2), P(3) and respectively have values of +1, 0 and −1, and the following equation is considered.

$$A=(P(1)+1)*9+(P(2)+1)*3+P(3)$$

At this time, "A" has a positive value of 0 to 26 and can be expressed by five bits. This means that each sample can be expressed by 5/3=approx. 1.7 bits and the data amount can be reduced by approx. 15% in comparison with a case wherein two bits are used for each sample.

Further, "A" can be simply decoded by setting P(1), P(2), P(3) as follows.

$$P(1)=(A/9)-1$$

$$A=A-(P(1)+1)*9$$

$$P(2)=(A/3)-1$$

$$A=A-(P(2)+1)*3$$

$$P(3)=A$$

FIGS. 17A and 17B show a case wherein actual sample data is coded in a group form when each sample has one of five values of +2, +1, 0, −1, −2. If three samples shown in FIG. 17A are collected and coded in a group form as shown in FIG. 17B to derive the following equation, the value of "A" becomes one of 0 to 124 and can be expressed by seven bits.

$$A=(P(1)+2)*25+(P(2)+2)*5+P(3)+2$$

This means that each sample can be expressed by 7/3=2.3 bits and the data amount can be reduced by 22% in comparison with a case wherein three bits are used for each sample.

By thus using the group-coding method, data can be efficiently compressed. The compression process is a lossless compression coding process and original data can be completely decoded.

As another method for compression-coding an error signal, it is possible to more efficiently effect the data compression if a plurality of samples of the error signal are collected to construct each block and set the number of representation bits for each block according to the maximum one of the absolute values of the error signals in the block and it becomes possible to further effect the data compression by subjecting them to the group-coding process.

In the above data compression coding process, a case wherein the error signal is used is explained, but it is of course possible to effect the compression coding process by use of the bit reducing method or the like, for example, for the high-frequency signal.

As described above, according to this invention, it is possible to make the transmission/recording system for wideband signals and the transmission/recording system for narrow-band signals compatible with each other and compress the data amount without deteriorating the quality of the signal content at all.

Further, according to this invention, it is possible to form a reproducing/decoding unit according to the required quality and cost while using the same transmission media and recording media and the user can freely select them.

Next, an optical disk system to which this invention is applied is briefly explained with reference to the drawings. FIG. 18 shows an optical disk reproducing apparatus, FIG. 19 shows the basic construction of a disk drive section 501 for driving an optical disk 100 on which the above-described audio stream is recorded and FIG. 20 shows an example of the construction of the optical disk 100.

First, the optical disk reproducing apparatus shown in FIG. 18 is explained. The optical disk reproducing apparatus includes a key operation/display section 500. To the optical disk reproducing apparatus, a monitor M, right and left speakers SPL, SPR are connected. Pickup data read out from the optical disk 100 is supplied to a system processing section 504 via a disk drive section 501.

Pickup data read out from the optical disk 100 contains video data, sub-video data and audio data, for example. The data items are separated in the system processing section 504. Among them, the separated video data is supplied to a video decoder 508 via a video buffer 506.

Further, the separated sub-video data is supplied to a sub-video decoder 509 via a sub-video buffer 507. The separated audio data is supplied to an audio decoder 513 via an audio buffer 512.

The video signal decoded by the video decoder 508 and the sub-video signal decoded by the sub-video decoder 509 are synthesized in a synthesizing section 510, then converted into an analog video signal by a D/A (digital/analog) converter 511 and supplied to the monitor M. The audio signal decoded in the audio decoder 513 is converted into an analog audio signal in a D/A converter 514 and then supplied to the speakers SPL and SPR.

In FIG. 18, a reference numeral 502 denotes a system CPU (Central Processing Unit). The whole portion of the optical disk reproducing apparatus is managed by the system CPU 502. The system CPU 502 can transfer control signals, timing signals and the like with respect to the disk drive section 501, system processing section 504 and key operation/display section 500.

The system CPU 502 is connected to a system ROM (Read Only Memory)/RAM (Random Access Memory) section 503. The system ROM/RAM section 503 is used for storing fixed programs necessary for the system CPU 502 to effect the data processing and store management data reproduced from the optical disk 100.

A data RAM 505 is connected to the system processing section 504 and used as a buffer when the above data items are separated or the error thereof is corrected.

Next, the disk drive section 501 shown in FIG. 19 is explained. First, a disk motor driving circuit 531 drives a spindle motor 532. When the spindle motor 532 rotates, the optical disk 100 rotates and recording data recorded on the optical disk 100 can be read out by an optical head section 533. A signal read out by the optical head section 533 is supplied to a head amplifier 534 and an output of the head amplifier 534 is input to the system processing section 504.

A feed motor 535 is driven by a feed motor driving circuit 536. The feed motor 535 is used as a driving source for moving the optical head section 533 in the radial direction of the optical disk 100. In the optical head section 533, a focusing mechanism and a tracking mechanism are provided and the mechanisms are respectively supplied with driving signals output from a focusing circuit 537 and tracking circuit 538.

Control signals from the servo processing circuit 539 are input to the disk motor driving circuit 531, feed motor driving circuit 536, focusing circuit 537 and tracking circuit 538. The disk motor 532 controls the rotation speed of the optical disk 100 to set the frequency of the pickup data equal to a preset frequency.

The focusing circuit 537 controls the focusing mechanism of the optical system to focus the optical beam of the optical head 533 on the best point of the optical disk 100. The tracking circuit 538 controls the tracking mechanism to apply the optical beam to the central portion of a desired recording track.

Next, the construction of the optical disk 100 shown in FIG. 20 is explained. The optical disk 100 has an information recording area 102 formed around a clamp area 101 in the central portion on each surface thereof. The information recording area 102 has a lead-out area 103 on which no information is recorded in the outer peripheral portion thereof and a lead-in area 104 on which no information is recorded in a boundary portion adjacent to the clamp area 101. A portion between the lead-out area 103 and the lead-in area 104 is defined as a data recording area 105.

On the data recording area 105, a track is continuously formed in a spiral form. The track is formed as a pit-form signal series. The track is divided into a plurality of physical sectors to which consecutive numbers are attached.

In an optical disk 100 used only for reading, a recording layer is formed by forming a series of pits in a transparent plate by use of a stamper and covering the pit series forming surface with a reflection film. In an optical disk 100 of two-sheet laminating type, two disks are attached to each other with the recording layers set to face each other so as to construct a composite disk.

Next, the logical format of the optical disk 100 is explained. FIG. 21 shows a logical format indicating information segments of the data recording area 105. The logical format is defined according to a specified standard as is represented by micro UDF and ISO9660, for example.

In the following explanation, the logical address indicates a logical sector number (LSN) defined by the micro UDF and ISO9660. The logical sector has the same size as the physical sector described before and one logical sector is constructed by 2048 bytes. Further, assume that consecutive numbers are attached to the logical sector numbers (LSN) according to the ascending order of the physical sector numbers.

The logical format has a hierarchical structure. That is, it has a volume and file structure area, video manager area, at least one video title set area and other recording area. The above areas are separated on the boundaries between the logical sectors. That is, one logical sector is constructed by 2048 bytes, one logical block is constructed by 2048 bytes, and one logical sector is defined as one logical block.

The volume and file structure area corresponds to a management area defined by the micro UDF and ISO9660. That is, data in the video manager area is stored in the system ROM/RAM section 503 via the description in the above area. In the video manager area, information for managing the video title set is described. The information is constructed by a plurality of files starting from a file #0.

In the video title set, compressed video data, sub-video data, audio data and reproduction control information for reproducing the above data items are recorded. In the other recording area, information used when the information of video title set is used or information independently used is recorded.

Next, the video manager is explained with reference to FIG. 22. The video manager is constructed by video manger information (VMGI), video object set (VMGM_VOBS) for video manager information menu and backup (VMGI_BUP) of volume manager information.

In the video object set (VMGM_VOBS) among the above information items, video data, sub-video data and audio data for a menu relating to the volume of the optical disk 100 which the video manager manages are stored. That is, display of selection of the title and explanation information by audio and sub-video relating to the titles in the volume can be obtained.

For example, if the optical disk is a disk which stores English conversation data for learning the English language, the title name of the English conversation and examples of the lesson are reproduced and displayed by use of main video data, a theme song is reproduced by sound, and the level of the teaching material is displayed by use of sub-video data. As the selection item, for example, a display screen used for selecting the number (level) of the lesson is displayed and data entry by operation of the learner is waited. For this application, the video object set (VMGM_VOBS) is used.

FIG. 23 shows an example of the video object set (VMGM_VOBS). As the video object set (VMGM_VOBS), two types are prepared for menu and one type is prepared for the video title, but in either case, the video object set has the same structure.

The video object set (VMGM_VOBS) is defined as a set of one or more video objects (VOB). The video object (VOB) is used for the same application. Generally, the video object set (VMGM_VOBS) for menu is constructed as a video object (VOB) for displaying a plurality of menu screens.

Further, the video object set (VMGM_VOBS) for video title set is constructed as a video object (VOB) for displaying a normal moving picture.

To each of the video objects (VOB), a corresponding identification number (VOB_IDN#j) is attached. Each of the video objects (VOB) can be specified by use of the identification number (VOB_IDN#j). One video object (VOB) is constructed by one cell or a plurality of cells. To each of the plurality of cells, a corresponding identification number (C_IDN#j) is attached.

Each of the cells can be specified by use of the identification number (C_IDN#j). The video object (VOB) for menu may be constructed by one cell in some cases.

Further, one cell is constructed by one video object unit (VOBU) or a plurality of video object units (VOBU). One video object unit (VOBU) is defined as a pack series having one navigation pack (NAV pack) in the head portion. That is, one video object unit (VOBU) is defined as a set of all of the packs recorded in a range from the NAV pack to a next NAV pack.

The reproduction time of the video object unit (VOBU) corresponds to the reproduction time of video data constructed by one GOP (Group Of Picture) or a plurality of GOPs contained therein and is defined in a range of approx. 0.4 sec. to 1 sec. According to the MPEG (Moving Picture Image Coding Experts Group) standard, one GOP is treated as data obtained by compressing image data corresponding to the reproduction time of approx. 0.5 sec.

Therefore, in order to meet the MPEG standard, information of approx. 0.5 sec. containing audio and video data is arranged in one video object unit (VOBU).

Further, in one video object unit (VOBU), a video pack (V pack), sub-video pack (SP pack) and audio pack (A pack) are arranged with the above NAV pack set in the head position. Therefore, in a plurality of video packs (V packs) contained in one video object unit (VOBU), compressed image data whose reproduction time is less than 1 sec. is arranged in the form of one GOP or a plurality of GOPs.

Further, in one video object unit (VOBU), an audio signal corresponding to the reproduction time thereof is arranged in a compressed form as an audio pack (A pack). In addition, in one video object unit (VOBU), sub-video data used in the reproduction time thereof is arranged in a compressed form as a sub-video pack (SP pack).

However, the audio signal is recorded by forming data of 8 steams, that is, data of 32 streams, for example, as sub-video data in a pack form. One stream of the audio signal is data coded in one type of coding format and is constructed by eight channels of linear PCM, 20-bit quantization data, for example.

The video manager information (VMGI) shown in FIG. 22 is information used for searching for a video title and includes at least three tables.

First, in a video managing information management table (VMGI_MAT), attribute information items relating to the size of the video manager (VMG), the start address of each information in the video manager and the video object set (VMGM_VOBS) for video manager menu are described.

In a title search pointer table (TT_SRPT), an entry program chain (EPGC) of the video title contained in the volume of the optical disk 100 which can be selected according to the entry of a title number from the key operation/display section 500 of the optical disk reproducing apparatus is described.

Figure 24:
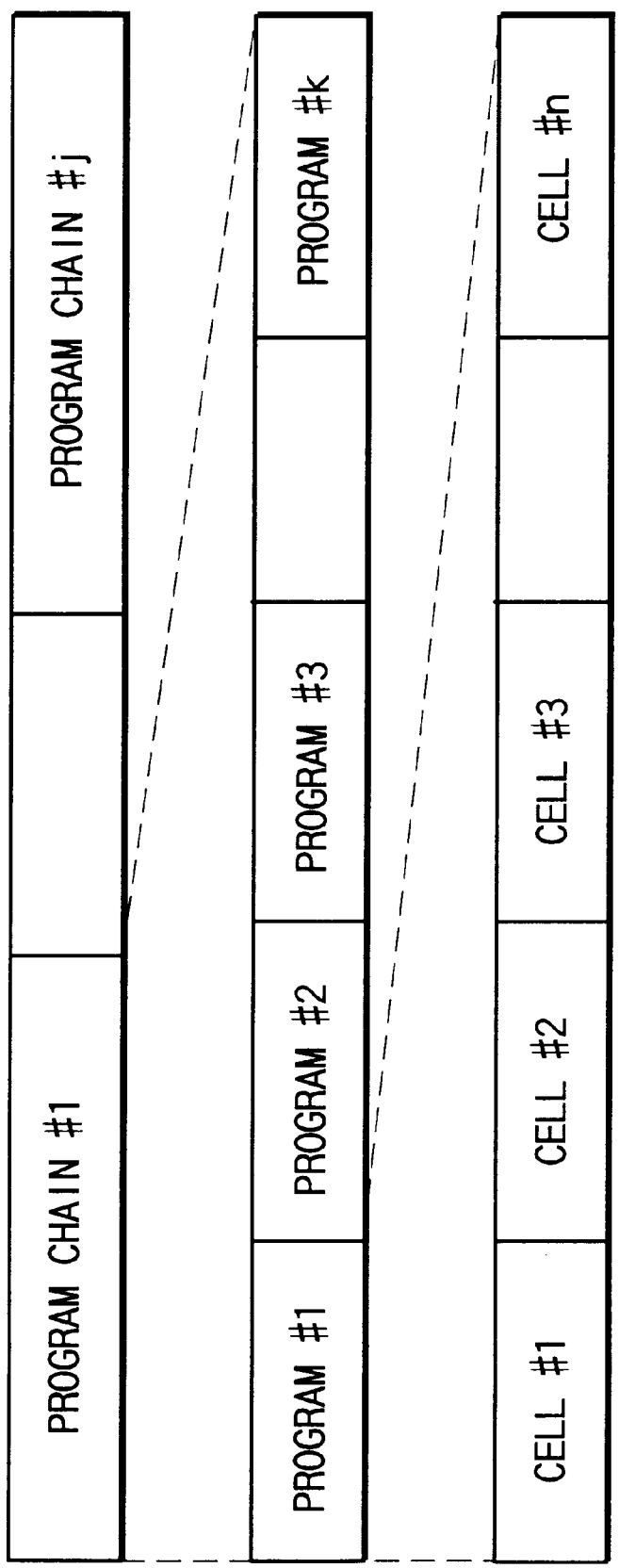
FIG. 24 is a diagram for illustrating a program chain in the video manager.

FIG. 24 illustrates a program chain. The program chain is a set of programs for reproducing a story of a title and the story or the story chapter of one title is completed by successively reproducing the programs. One program is constructed by a plurality of cells. The cell identifying number can specify a cell in the video object set (VMGM_VOBS).

In a video title set attribute table (VTS_ART), attribute information defined in the video title set (VTS) provided in the volume of the optical disk 100 is described. As the attribute information, the number of video title sets (VTS), the number of each video title set, the compression system of video data, the coding mode of audio data and the display type of sub-video data are provided.

In the optical disk reproducing apparatus for effecting the above-described reproduction process, measures of the first to eighth embodiments explained with reference to FIGS. 1A and 1B to FIGS. 17A and 17B are taken for the audio signal. Further, in the processing system of the audio signal, desired data of the audio pack (A pack) shown in FIG. 23 can be reproduced.

In a new optical disk reproducing apparatus, the ID thereof is identified, the low-frequency and high-frequency signals are reproduced, but if the high-frequency signal cannot be processed, only the low-frequency signal is reproduced without recognizing the audio pack (A pack). Even if only the low-frequency signal is reproduced, the bandwidth of 0 to 48 kHz can be obtained, and therefore, the high-quality audio reproduction can be attained as the normal audio reproduction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lossless compression coding method of digital data comprising:

dividing an input digital data string into at least two portions, one such portion comprising a block unit including a plurality of bit samples;

removing the same number of bits from each sample of the one portion starting from a sign bit side thereof for all of the samples in the block to form a compressed block;

dividing the compressed block into a subblock unit including a plurality of samples;

removing the same number of bits from the subblock sample starting from a sign bit side thereof for all of the samples in the subblock; and attaching information indicating the number of bits removed from each of the samples in the subblock to at least one of the compressed blocks and the compressed subblocks.

2. A lossless compression coding method of digital data comprising:

dividing an input digital data string into at least two portions, one such portion comprising a block unit including a plurality of bit samples;

removing the same number of bits from each sample, of the one portion, starting from the sign bit side thereof for all of the samples in the block to form a compressed block; and attaching instruction information indicating the number of removed bits in a corresponding one of the samples by issuing an instruction for adding or subtracting a preset number to or from the number of removed bits of a preceding sample for each of the plurality of samples constructing the compressed block.

3. A lossless compression coding apparatus of digital data comprising:

first means for dividing an input digital data string into at least two portions, one such portion comprising a block unit including a plurality of bit samples;

second means for reducing the same number of bits from each sample of the one portion starting from a sign bit side thereof for all of the samples in each block obtained in said first means, said second means forming a compressed block thereby;

third means for attaching information items each indicating the number of removed bits to respective compressed blocks obtained in said second means;

fourth means for dividing the compressed block into subblock units constructed by a plurality of samples in which the number of bits is reduced;

fifth means for removing a constant number of bits having a common value from each sample starting from a sign bit side thereof for all of the samples in each subblock obtained in said fourth means; and sixth means for attaching information indicating the number of bits removed from each of the samples in the subblock to at least one of the compressed block and the compressed subblock obtained in said fifth means.

4. A lossless compression coding apparatus of digital data comprising:

first means for dividing an input digital data string into at least two portions, one such portion comprising a block unit including a plurality of bit samples;

second means for reducing the same number of bits from each sample of the one portion starting from a sign bit side thereof for all of the samples in each block obtained in said first means to form a compressed block; and third means for attaching instruction information indicating the number of removed bits in a corresponding one of the samples by issuing an instruction for adding or subtracting a preset number to or from the number of removed bits of a preceding sample for each of a plurality of samples constructing the compressed block obtained in said second means.

5. A decoding method for decoding digital data subjected to a lossless compression coding process and dealing with coded data in which the coded data is obtained by dividing a compressed block into subblock units constructed by a plurality of samples in which a number of bits is reduced, removing the same number of bits from each sample starting from a sign bit side thereof for all of the samples in each subblock to form compressed subblocks, and attaching subblock side information indicating the number of removed bits in each sample in the subblock to at least one of the compressed subblocks and the compressed block, the method comprising:

creating data of the removed bits based on the subblock side information derived from the coded data; and decoding an original subblock by attaching the data created in said creating to all of the samples in the compressed subblock.

6. A decoding method for decoding digital data subjected to a lossless compression coding process and dealing with coded data obtained by dividing an input digital data string into at least two portions, one such portion comprising a block unit including a plurality of bit samples, removing a constant number of bits having a same number of bits from each sample of the one portion to form a compressed block, and attaching instruction information indicating the number of removed bits in a corresponding one of the samples by issuing an instruction for adding or subtracting a preset number to or from the number of removed bits of a preceding sample for each of the plurality of samples constructing the compressed block, the method comprising:

creating data of the removed bits based on the block side information derived from the coded data;

decoding an original block by attaching the data created said creating to all of the samples in the compressed block; and deriving data of the removed bits for each of the samples in the compressed block based on the instruction information derived from the coded data and attaching the derived data to a corresponding one of the samples.

7. A decoding apparatus for decoding digital data subjected to a lossless compression coding process and dealing with coded data in which the coded data is obtained by dividing a, digital data string into at least two portions, one such portion comprising a block unit including a plurality of bit samples, removing a same number of bits from each sample of the one portion starting from a sign bit side thereof for all of the samples in each block to form a compressed block, and dividing the compressed block into subblock units, removing the same number of bits from each sample starting from the sign bit side thereof for all of the samples in each subblock to form compressed subblocks, and attaching subblock side information indicating the number of removed bits in each sample in the subblock to at least one of the compressed subblock and the compressed block, the apparatus comprising:

first means for creating data of the removed bits based on the block side information derived from the coded data;

second means for decoding an original block by attaching the data created in said first means to all of the samples in the compressed block;

third means for creating data of the removed bits based on the subblock side information derived from the coded data; and fourth means for decoding an original subblock by attaching the data created in said third means to all of the samples in the compressed subblock.

8. A decoding apparatus for decoding digital data subjected to a lossless compression coding process and dealing with coded data obtained by dividing a digital data string transmitted in the unit of sample constructed by a preset number of bits into block units constructed by a plurality of samples, removing a same number of bits from each sample starting from the sign bit side thereof for all of the samples in each block to form compressed blocks, and attaching instruction information indicating the number of removed bits in a corresponding one of the samples by issuing an instruction for adding or subtracting a preset number to or from the number of removed bits of a preceding sample for each of a plurality of samples constructing the compressed block, the apparatus comprising:

first means for creating data of the removed bits based on the block side information derived from the coded data;

second means for decoding an original block by attaching the data created in said first means to all of the samples in the compressed block; and third means for deriving data of the removed bits for each sample in the compressed block based on the instruction information derived from the coded data and attaching the derived data to a corresponding one of the samples.

9. A digital data transmitting method comprising:

a first step of dividing input digital data into a low-frequency signal and a high-frequency signal;

a second step of deriving a difference between adjacent preceding and succeeding samples of the high-frequency signal obtained in said first step;

a third step of subjecting the difference data obtained in said second step to a lossless compression coding process; and a fourth step of converting the high-frequency signal subjected to the lossless compression coding process in said third step and the low-frequency signal obtained in said first step into a transmission format.

10. A digital data transmitting method comprising:

a first step of dividing input digital data into a low-frequency signal and a high-frequency signal;

a second step of subjecting the high-frequency signal obtained in said first step to a lossless compression coding process;

a third step of synthesizing the high-frequency signal and the low-frequency signal obtained in said first step and deriving a difference between the synthesized signal and the input digital data; and a fourth step of converting the difference signal derived in said third step, the high-frequency signal subjected to the lossless compression coding process in said second step and the low-frequency signal obtained in said first step into a transmission format.

11. A digital data transmitting apparatus comprising:

a subband analyzing filter for dividing input digital data into a low-frequency signal and a high-frequency signal;

coding means for subjecting the high-frequency signal output from said subband analyzing filter to a lossless compression coding process; and a formatter for converting the high-frequency signal subjected to the lossless compression coding process by said coding means and the low-frequency signal output from said subband analyzing filter into a transmission format.

12. A digital data transmitting apparatus comprising:

a subband analyzing filter for dividing input digital data into a low-frequency signal and a high-frequency signal;

difference coding means for deriving a difference between adjacent preceding and succeeding samples of the high-frequency signal output from said subband analyzing filter;

coding means for subjecting the difference data output from said difference coding means to a lossless compression coding process; and a formatter for converting the high-frequency signal subjected to the lossless compression coding process by said coding means and the low-frequency signal output from said subband analyzing filter into a transmission format.

13. A digital data transmitting apparatus comprising:

a subband analyzing filter for dividing input digital data into a low-frequency signal and a high-frequency signal;

coding means for subjecting the high-frequency signal output from said subband analyzing filter to a lossless compression coding process;

a subband synthesizing filter for synthesizing the high-frequency signal and the low-frequency signal output from said subband analyzing filter and deriving a difference between the synthesized signal and the input digital data; and a formatter for converting the difference signal output from said subband synthesizing filter, the high-frequency signal subjected to the lossless compression coding process and output from said coding means and the low-frequency signal output from said subband analyzing filter into a transmission format.

14. A digital data receiving method for dealing with transmission data obtained by dividing digital data into a low-frequency signal and a high-frequency signal and converting the low-frequency signal and a signal obtained by subjecting the high-frequency signal to a lossless compression coding process into a transmission format, comprising:

a first step of separating the transmission data into the low-frequency signal and the high-frequency signal;

a second step of subjecting the high-frequency signal obtained in said first step to a decoding process corresponding to said lossless compression coding process; and a third step of synthesizing the high-frequency signal obtained in said second step and the low-frequency signal obtained in said first step.

15. A digital data receiving method for dealing with transmission data obtained by dividing digital data into a low-frequency signal and a high-frequency signal and converting the low-frequency signal and a signal obtained by subjecting difference data between adjacent preceding and succeeding samples of the high-frequency signal to a lossless compression coding process into a transmission format, comprising:

a first step of separating the transmission data into the low-frequency signal and the difference data;

a second step of subjecting the difference data obtained in said first step to a decoding process corresponding to said lossless compression coding process;

a third step of decoding the difference data obtained in said second step into the original high-frequency signal; and a fourth step of synthesizing the high-frequency signal obtained in said third step and the low-frequency signal obtained in said first step.

16. A digital data receiving method for dealing with transmission data obtained by dividing digital data into a low-frequency signal and a high-frequency signal and converting the low-frequency signal, a signal obtained by subjecting the high-frequency signal to a lossless compression coding process and a difference signal between the digital data and a synthesized signal of the low-frequency signal and the high-frequency signal into a transmission format, comprising:

a first step of separating the transmission data into the low-frequency signal and the high-frequency signal;

a second step of subjecting the high-frequency signal obtained in said first step to a decoding process corresponding to said lossless compression coding process;

a third step of synthesizing the high-frequency signal obtained in said second step and the low-frequency signal obtained in said first step; and a fourth step of synthesizing the synthesized signal obtained in said third step and the difference signal obtained in said first step.

17. A digital data receiving apparatus for dealing with transmission data obtained by dividing digital data into a low-frequency signal and a high-frequency signal and converting the low-frequency signal and a signal obtained by subjecting the high-frequency signal to a lossless compression coding process into a transmission format, comprising:

a de-formatter for separating the transmission data into the low-frequency signal and the high-frequency signal;

decoding means for subjecting the high-frequency signal output from said de-formatter to a decoding process corresponding to said lossless compression coding process; and a subband synthesizing filter for synthesizing the high-frequency signal output from said decoding means and the low-frequency signal output from said de-formatter.

18. A digital data receiving apparatus for dealing with transmission data obtained by dividing digital data into a low-frequency signal and a high-frequency signal and converting the low-frequency signal and a signal obtained by subjecting difference data between adjacent preceding and succeeding samples of the high-frequency signal to a lossless compression coding process into a transmission format, comprising:

a de-formatter for separating the transmission data into the low-frequency signal and the difference data;

decoding means for subjecting the difference data output from said de-formatter to a decoding process corresponding to said lossless compression coding process; and difference decoding means for decoding the difference data output from said decoding means into the original high-frequency signal; and a subband synthesizing filter for synthesizing the high-frequency signal output from said difference decoding means and the low-frequency signal output from said de-formatter.

19. A digital data receiving apparatus for dealing with transmission data obtained by dividing digital data into a low-frequency signal and a high-frequency signal and converting the low-frequency signal, a signal obtained by subjecting the high-frequency signal to a lossless compression coding process and a difference signal between the digital data and a synthesized signal of the low-frequency signal and the high-frequency signal into a transmission format, comprising:

a de-formatter for separating the transmission data into the low-frequency signal, the high-frequency signal and the difference signal;

decoding means for subjecting the high-frequency signal output from said de-formatter to a decoding process corresponding to said lossless compression coding process;

a subband synthesizing filter for synthesizing the high-frequency signal output from said decoding means and the low-frequency signal output from said de-formatter; and adding means for combining the synthesized signal output from said subband synthesizing filter and the difference signal output from said de-formatter.

20. A digital data recording medium on which data obtained by dividing digital data into a low-frequency signal and a high-frequency signal and converting the low-frequency signal and a signal obtained by subjecting the high-frequency signal to a lossless compression coding process into a transmission format is recorded.

21. A digital data recording medium on which data obtained by dividing digital data into a low-frequency signal and a high-frequency signal and converting the low-frequency signal and a signal obtained by subjecting difference data between adjacent preceding and succeeding samples of the high-frequency signal to a lossless compression coding process into a transmission format is recorded.

22. A digital data recording medium on which data obtained by dividing digital data into a low-frequency signal and a high-frequency signal and converting the low-frequency signal, a signal obtained by subjecting the high-frequency signal to a lossless compression coding process and a difference signal between the digital data and a synthesized signal of the low-frequency signal and the high-frequency signal into a transmission format is recorded.

* * * * *